(12) United States Patent
Kim et al.

(10) Patent No.: US 11,520,440 B2
(45) Date of Patent: Dec. 6, 2022

(54) SENSING PART AND DISPLAY DEVICE INCLUDING THE SAME

(71) Applicant: Samsung Display Co., Ltd., Yongin-si (KR)

(72) Inventors: Ji-sun Kim, Seoul (KR); Mukyung Jeon, Ulsan (KR)

(73) Assignee: Samsung Display Co., Ltd., Yongin-si (KR)

(*) Notice: Subject to any disclaimer, the term of this patent is extended or adjusted under 35 U.S.C. 154(b) by 68 days.

(21) Appl. No.: 16/185,009

(22) Filed: Nov. 9, 2018

(65) Prior Publication Data

US 2019/0138131 A1    May 9, 2019

(30) Foreign Application Priority Data

Nov. 9, 2017 (KR) .................. 10-2017-0148967

(51) Int. Cl.
*G06F 3/044* (2006.01)
*G06F 3/041* (2006.01)
*G09G 3/20* (2006.01)
*H01L 27/32* (2006.01)
*G06V 40/13* (2022.01)

(52) U.S. Cl.
CPC ............ *G06F 3/044* (2013.01); *G06F 3/0412* (2013.01); *G06F 3/0416* (2013.01); *G06V 40/1306* (2022.01); *G09G 3/20* (2013.01); *G09G 3/2092* (2013.01); *H01L 27/323* (2013.01);
(Continued)

(58) Field of Classification Search
CPC .......... G06F 3/20; G06F 3/044; G06F 3/0412; G06F 3/0416; G06F 2203/04103; G06F 2203/04111; H01L 27/323; G06K 9/0002; G09G 3/2092; G09G 2300/0426
See application file for complete search history.

(56) References Cited

U.S. PATENT DOCUMENTS 9,223,425 B1 * 12/2015 Kim .................. G06F 3/04166
9,660,003 B2    5/2017 Sato et al.
(Continued)

FOREIGN PATENT DOCUMENTS

CN         107153488     9/2017
EP         3051589       8/2016
(Continued)

OTHER PUBLICATIONS

Partial European Search Report dated Mar. 14, 2019, issued in European Patent Application No. 18203011.4.
(Continued)

*Primary Examiner* — Ifedayo B Iluyomade
(74) *Attorney, Agent, or Firm* — H.C. Park & Associates, PLC

(57) ABSTRACT

A display device includes a display panel having a display area displaying an image and a non-display area disposed outside of the display area, and a sensing part including a plurality of sensing electrodes, a plurality of sensing circuits corresponding one-to-one to the plurality of sensing electrodes, and a plurality of sensing lines connecting the plurality of sensing electrodes and the plurality of sensing circuits in one-to-one. The plurality of sensing electrodes are disposed in an area overlapping the display area, and the plurality of sensing circuits are disposed in an area overlapping the non-display area.

18 Claims, 20 Drawing Sheets

(52) U.S. Cl.
CPC .............. *G06F 2203/04103* (2013.01); *G06F 2203/04111* (2013.01); *G09G 2300/0426* (2013.01)

(56) References Cited

U.S. PATENT DOCUMENTS

| | | | |
|---|---|---|---|
| 9,836,165 | B2 | 12/2017 | Nho et al. |
| 10,347,699 | B2 | 7/2019 | Kwon et al. |
| 10,353,513 | B2 | 7/2019 | Mizuhashi et al. |
| 10,466,808 | B2 | 11/2019 | Yi et al. |
| 10,627,966 | B2 * | 4/2020 | Na .................. G06F 3/0412 |
| 10,804,337 | B2 * | 10/2020 | Jang .................. H01L 27/3262 |
| 2010/0128189 | A1 * | 5/2010 | Teranishi .............. G02F 1/1323 349/33 |
| 2012/0286800 | A1 * | 11/2012 | Maharyta ........... H03K 17/9622 324/603 |
| 2013/0147730 | A1 | 6/2013 | Chien et al. |
| 2013/0342479 | A1 * | 12/2013 | Pyo .................. G06F 3/044 345/173 |
| 2015/0091819 | A1 | 4/2015 | Wang |
| 2015/0144920 | A1 | 5/2015 | Yamazaki et al. |
| 2016/0103537 | A1 * | 4/2016 | Park ................. G06F 3/044 345/174 |
| 2016/0218151 | A1 | 7/2016 | Kwon et al. |
| 2016/0292487 | A1 | 10/2016 | Sun et al. |
| 2016/0350571 | A1 | 12/2016 | Han et al. |
| 2017/0075493 | A1 * | 3/2017 | Lee .................. G06F 3/0414 |
| 2017/0091508 | A1 | 3/2017 | Han et al. |
| 2017/0153752 | A1 * | 6/2017 | Kurasawa ......... G02F 1/133512 |
| 2017/0186163 | A1 | 6/2017 | Kim |
| 2017/0228572 | A1 | 8/2017 | Lee et al. |
| 2017/0293378 | A1 | 10/2017 | Ahn et al. |
| 2017/0351364 | A1 | 12/2017 | Kim et al. |
| 2018/0136502 | A1 | 5/2018 | Mugiraneza et al. |
| 2018/0308902 | A1 * | 10/2018 | Lee ................. G06F 3/0412 |
| 2018/0314369 | A1 | 11/2018 | Yashiro et al. |
| 2018/0329554 | A1 * | 11/2018 | Beak ................ H01L 27/3246 |
| 2019/0025969 | A1 | 1/2019 | Liu et al. |
| 2019/0103060 | A1 * | 4/2019 | Kang ................ H01L 27/124 |

FOREIGN PATENT DOCUMENTS

| | | |
|---|---|---|
| JP | 2017-182348 | 10/2017 |
| KR | 10-2016-0093184 | 8/2016 |
| KR | 10-2017-0039050 | 4/2017 |
| KR | 10-2017-0067077 | 6/2017 |
| KR | 10-1748123 | 6/2017 |
| WO | 2016/163303 | 10/2016 |
| WO | 2017/069114 | 4/2017 |

OTHER PUBLICATIONS

Extended European Search Report dated May 15, 2019, in European Patent Application No. 18203011.4.

* cited by examiner

SENSING PART AND DISPLAY DEVICE INCLUDING THE SAME

CROSS-REFERENCE TO RELATED APPLICATION

This application claims priority from and the benefit of Korean Patent Application No. 10-2017-0148967, filed on Nov. 9, 2017, which is hereby incorporated by reference for all purposes as if fully set forth herein.

BACKGROUND

Field

Exemplary embodiments of the invention relate generally to a sensing part and a display device capable of recognizing the user's fingerprint.

Discussion of the Background

A display device may recognize the finger of a person touching the screen through a sensing part. A touch sensing method in a sensing unit includes various types such as a resistance film type, an optical type, an electrostatic capacitance type, and an ultrasonic type. Among them, the electrostatic capacitance type detects whether or not a touch occurs by using a capacitance that changes when a touch generating means contacts the screen of a display device.

Security of personal mobile devices such as smart phones and tablets has become increasingly important to consumers and businesses. One way to keep a mobile device secure is to require the use of biometric information to unlock the mobile device or to authenticate a user. For example, fingerprints may be used to unlock a mobile device or authenticate a user.

The above information disclosed in this Background section is only for understanding of the background of the invention concepts, and, therefore, it may contain information that does not constitute prior art.

SUMMARY

Exemplary embodiments relate to a sensing part and a display device capable of recognizing a user's fingerprint.

Additional features of the inventive concepts will be set forth in the description which follows, and in part will be apparent from the description, or may be learned by practice of the inventive concepts.

An exemplary embodiment provides a display device including: a display panel may include a display area and a non-display area disposed outside of the display area; and a sensing part including a plurality of sensing electrodes, a plurality of sensing circuits corresponding one-to-one to the plurality of sensing electrodes, and a plurality of sensing lines connecting the plurality of sensing electrodes and the plurality of sensing circuits one-to-one, wherein the plurality of sensing electrodes are disposed in an area overlapping the display area, and the plurality of sensing circuits are disposed in an area overlapping the non-display area.

In an exemplary embodiment, the display panel may further include a plurality of pixel electrodes disposed in the display area and a plurality of pixel circuits disposed in the display area and electrically connected to the plurality of pixel electrodes in one-to-one correspondence.

In an exemplary embodiment, the display panel may include: a base layer; a circuit layer disposed on the base layer and including the plurality of pixel circuits and the plurality of sensing circuits; a light emitting element layer disposed on the circuit layer; and a thin encapsulation layer configured to cover the light emitting element layer.

In an exemplary embodiment, the plurality of sensing electrodes may be disposed on the thin encapsulation layer.

In an exemplary embodiment, the plurality of sensing electrodes may be disposed between the light emitting element layer and the thin encapsulation layer.

In an exemplary embodiment, the display device may further include an insulation layer disposed on the plurality of sensing circuits, wherein the plurality of sensing lines may be disposed on the insulation layer, and each of the plurality of sensing lines may be electrically connected to each of the plurality of sensing circuits through a through hole provided in the insulation layer.

In an exemplary embodiment, the insulation layer may be the thin encapsulation layer.

In an exemplary embodiment, the display area may be divided into a sensing area where the plurality of sensing electrodes are disposed and a non-sensing area where the plurality of sensing electrodes are not disposed.

In an exemplary embodiment, the sensing part may further include a dummy pattern disposed in the non-sensing area, wherein the dummy pattern may be disposed on a same layer as the plurality of sensing electrodes.

In an exemplary embodiment, the dummy pattern may be provided with a predetermined level of voltage.

In an exemplary embodiment, when the same gradation is displayed, a driving voltage provided to the pixel electrodes disposed in the sensing area and a driving voltage provided to the pixel electrodes disposed in the non-sensing area may be different from each other.

In an exemplary embodiment, the plurality of sensing electrodes, the plurality of sensing circuits, and the plurality of pixel electrodes may be arranged in a matrix along a first direction and a second direction intersecting the first direction, wherein one sensing electrode of the plurality of sensing electrodes may overlap two or more pixel electrodes of the plurality of pixel electrodes on a plane, wherein a pitch of the plurality of sensing electrodes arranged in the first direction may be defined as a first pitch; a pitch of the plurality of sensing circuits arranged in the first direction may be defined as a second pitch; a pitch of the plurality of pixel electrodes arranged in the first direction may be defined as a third pitch; a pitch of the plurality of sensing electrodes arranged in the second direction may be defined as a fourth pitch; a pitch of the plurality of sensing circuits arranged in the second direction may be defined as a fifth pitch; and a pitch of the plurality of pixel electrodes arranged in the second direction may be defined as a sixth pitch, wherein the first pitch may be larger than the second pitch and the third pitch, the third pitch may be larger than the second pitch, the fourth pitch may be larger than or equal to the fifth pitch, and the fifth pitch may be larger than the sixth pitch.

In an exemplary embodiment, on a plane, a first area where one of the plurality of sensing electrodes is disposed may be greater than a second area where one of the plurality of sensing circuits is disposed and a third area where one of the plurality of pixel electrodes is disposed, and the third area may be larger than the second area.

In an exemplary embodiment, the display device may further include a touch sensing part disposed on the sensing part.

In an exemplary embodiment, the display device may further include a touch sensing part disposed on the display panel and including a plurality of touch sensing electrodes, wherein the plurality of touch sensing electrodes may be disposed on a same layer as the plurality of sensing electrodes.

In an exemplary embodiment, the plurality of sensing electrodes may be disposed in the entire display area on a plane.

In an exemplary embodiment, the plurality of sensing circuits may include a first sensing circuit, and the plurality of sensing electrodes may include a first sensing electrode electrically connected to the first sensing circuit, and a voltage value of a node to which the first sensing circuit and the first sensing electrode are electrically connected may be controlled by the first sensing circuit, and the first sensing electrode may be configured to form a capacitance with an external object to change the node value.

In an exemplary embodiment, a display device includes: a display panel where a display area and a non-display area are defined; and a sensing part including a sensing electrode disposed in an area overlapping with the display area, and a sensing circuit disposed in an area overlapping with the non-display area on a plane and the sensing circuit including a plurality of sensing transistors electrically connected to a node electrically connected to the sensing electrode, a scan line, and a lead-out line, wherein a voltage value of the node is controlled by a scan signal applied to the scan line, and the sensing electrode may be configured to form a capacitance with an external object to change the voltage value of the node and outputs a sensing signal through the lead-out line.

In an exemplary embodiment, the display panel may include a base layer, a circuit layer disposed on the base layer, a light emitting element layer disposed on the circuit layer, and a thin encapsulation layer disposed on the light emitting element layer, wherein the sensing electrode may be disposed on the thin encapsulation layer and the sensing circuit may be disposed on the base layer to be disposed on a same layer as the circuit layer.

In an exemplary embodiment, a sensing part includes: a base layer including an active area and an inactive area; a sensing circuit disposed in the inactive area and including a plurality of sensing transistors; an insulation layer configured to cover the sensing circuit and disposed on the base layer; a sensing electrode disposed on the insulation layer and disposed in the active area; and a sensing line electrically connecting the sensing electrode and the sensing circuit, wherein the sensing line is electrically connected to the sensing circuit through a through hole provided in the insulation layer in the inactive area, and wherein a voltage value of a node where the sensing circuit is connected to the sensing electrode is controlled by the plurality of sensing driving transistors.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the inventive concepts and are incorporated in and constitute a part of this specification, illustrate exemplary embodiments of the invention, and together with the description serve to explain principles of the inventive concepts.

DETAILED DESCRIPTION

Figure 1:
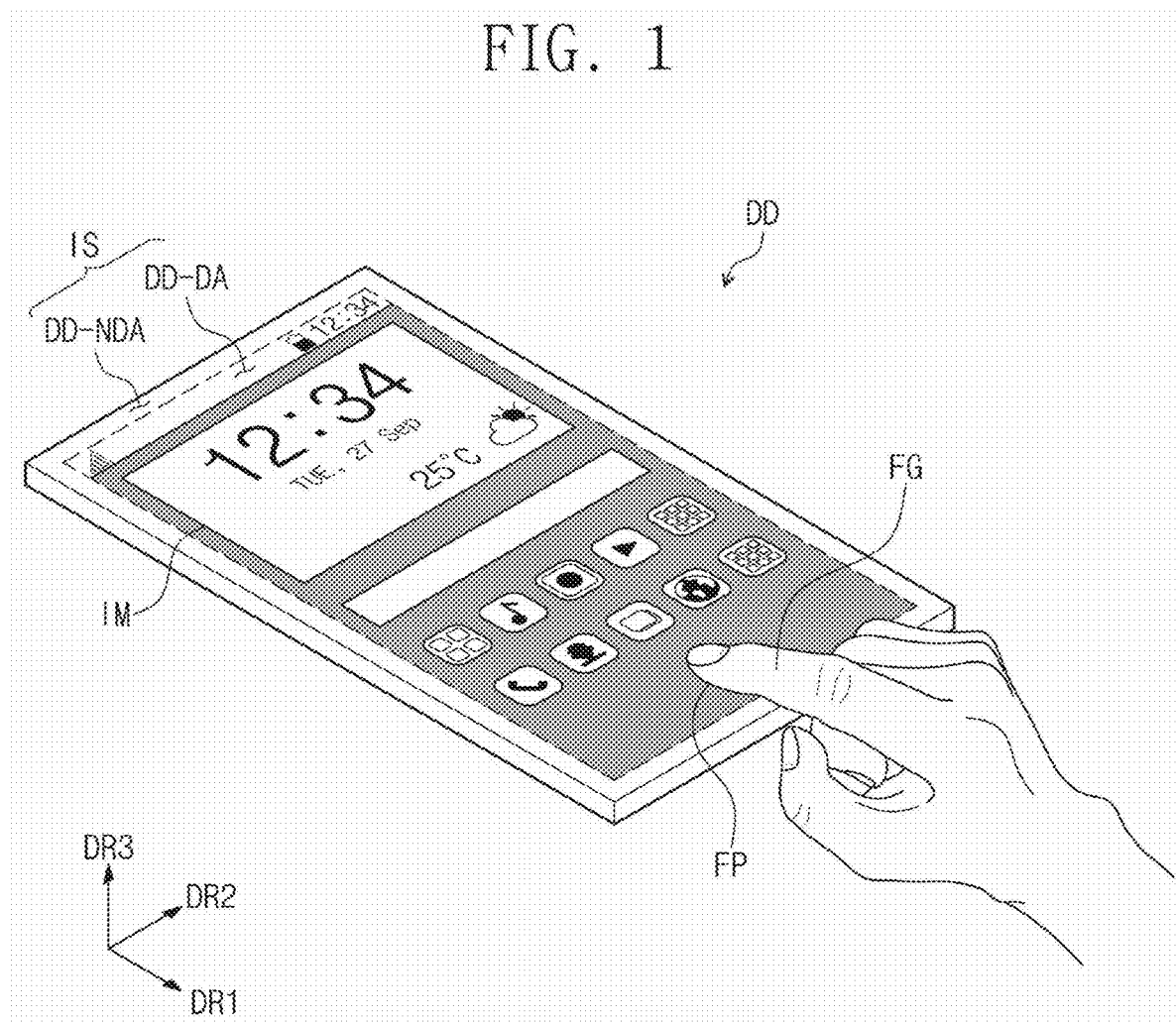
FIG. 1 is a cross-sectional view of a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

FIG. 1 is a cross-sectional view of a display device according to an exemplary embodiment.

Referring to FIG. 1, a display device DD may display an image IM through a display surface IS. Referring to FIG. 1, the display surface IS has a surface defined by a first direction DR1 and a second direction DR2 intersecting the first direction DR1. However, this is exemplary and in other embodiments, a display surface (not shown) of a display device (not shown) may have a curved shape.

The normal direction of the display surface IS, that is, a thickness direction of the display device DD, indicates a third direction DR3. The front surface (or an upper surface) and the rear surface (or a lower surface) of each member are divided by the third direction DR3. However, the directions that the first, second, and third directions DR1, DR2, and DR3 indicate may be converted to other directions as a relative concept. Hereinafter, first to third directions as directions that the respective first, second, and third directions DR1, DR2, and DR3 indicate refer to the same reference numerals.

In FIG. 1, a portable electronic device is exemplarily shown as the display device DD. However, the display device DD may be used in medium-sized electronic devices such as personal computers, notebook computers, personal digital terminals, car navigation units, game machines, smart phones, tablets, and cameras in addition to large-sized electronic devices such as televisions, monitors, or external billboards. These are simply suggested as embodiments and it is obvious that they are employed in other electronic devices without departing from the scope of the invention.

The display surface IS may include a display area DD-DA where an image IM is displayed and a non-display area DD-NDA adjacent to the display area DD-DA. The non-display area DD-NDA is an area where no image is displayed. FIG. 1 shows application icons as one example of the image IM. As one example, the display area DD-DA may have a rectangular form. The non-display area DD-NDA may surround the display area DD-DA. However, the inventive concept is not limited thereto, and a form of the display area DD-DA and a form of the non-display area DD-NDA may be designed relatively.

The display device DD may recognize the fingerprint FP of the user's finger FG. When the fingerprint FP of the user's finger FG contacts the display area DD-DA, the display device DD may recognize the fingerprint FP. The display device DD may recognize the user's fingerprint FP to determine whether the user is a legitimate user. In addition, the user's fingerprint FP may be used for mobile device security, financial transactions, system control, and the like.

Figure 2:
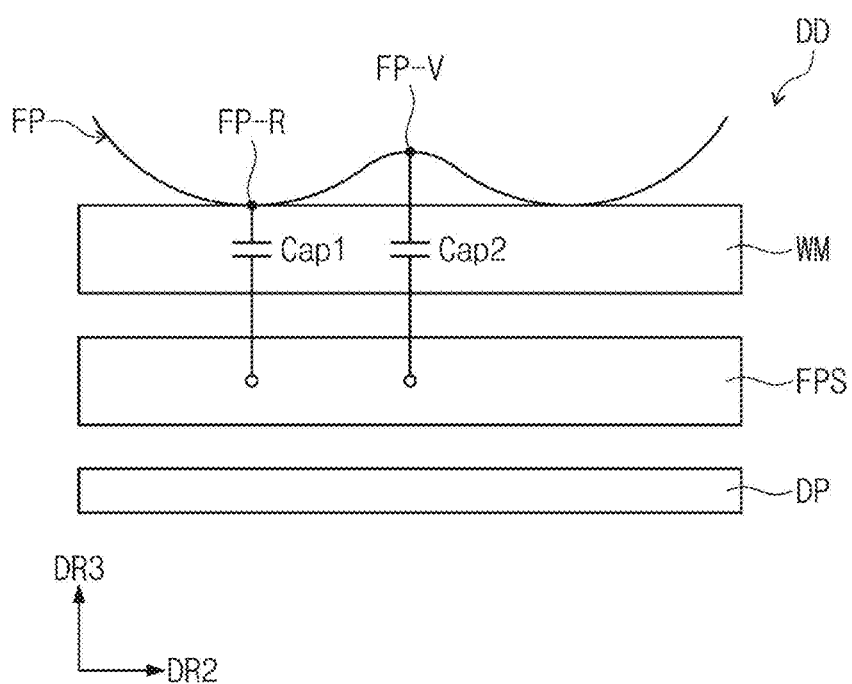
FIG. 2 illustrates a portion of a section of a display device according to an exemplary embodiment.

FIG. 2 illustrates a portion of a section of a display device according to an exemplary embodiment. FIG. 2 shows only a part of the configuration of the display device necessary for the explanation.

A display device DD may include a display panel DP, a window WM, and a sensing part FPS.

The display panel DP may include a plurality of light emitting elements. The display panel DP generates the image IM (see FIG. 1) corresponding to inputted image data. The process of forming the display panel DP may include Low Temperature Polycrystalline Silicon (LTPS) or Low Temperature Polycrystalline Oxide (LTPO) processes.

The window WM may be disposed above the display panel DP and may protect the modules disposed under the window WM from external impact and provide a user with a sensing surface. The display surface IS (see FIG. 1) may be a sensing surface for sensing an external input.

The external input includes various types of external inputs such as a part of the user's body, a stylus pen, light, heat, or pressure. Further, it is possible to detect a close or adjacent space touch (for example, hovering) in addition to a touch of a part of the body such as the user's hand. Also, the external input may be a user's fingerprint, and the sensing surface may be a fingerprint recognition surface for recognizing the fingerprint FP of the finger.

A sensing part FPS for recognizing the fingerprint FP may be disposed under the window WM. Some components of the sensing part FPS may be formed at the same time through a Low Temperature Polycrystalline Silicon (LTPS) or Low Temperature Polycrystalline Oxide (LTPO) process among the processes of manufacturing the display panel DP.

The fingerprint FP of a finger is illustratively shown to explain the fingerprint recognition. The fingerprint FP includes a ridge FP-R and a valley FP-V. A first capacitance Cap1 is formed between the ridge FP-R and the sensing part FPS and a second capacitance Cap2 is formed between the valley FP-V and the sensing part FPS. The first capacitance Cap1 and the second capacitance Cap2 have different values from each other. The sensing part FPS may recognize the fingerprint FP using the difference between the first capacitance Cap1 and the second capacitance Cap2.

Figure 3:
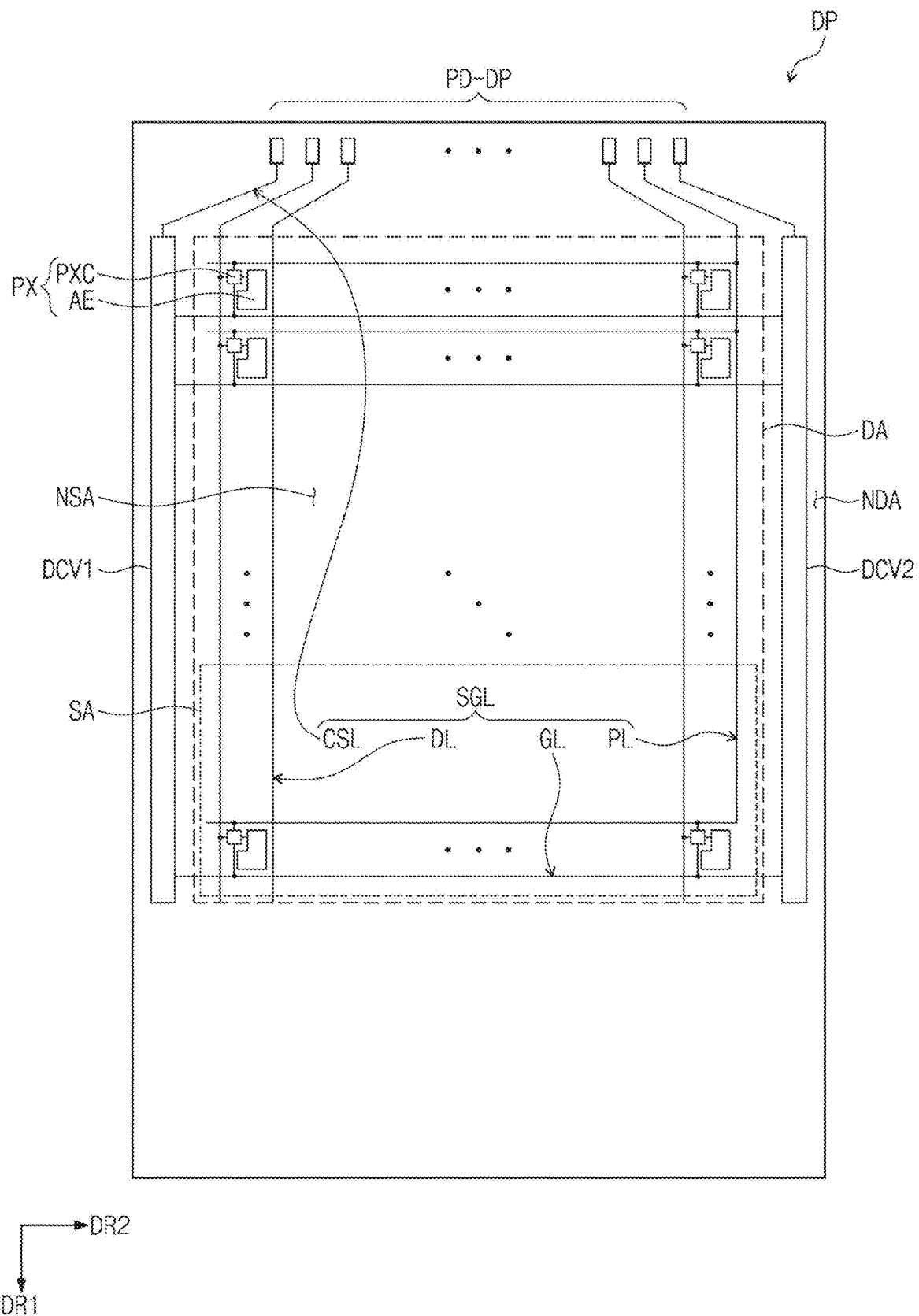
FIG. 3 is a plan view of a display panel according to an exemplary embodiment.

FIG. 3 is a plan view of a display panel according to an exemplary embodiment.

Referring to FIG. 3, the display panel DP includes a display area DA and a non-display area NDA disposed outside of the display area on a plane. The term "on the plane" may mean a view from the thickness direction of the display panel DP. The display area DA and the non-display area NDA of the display panel DP correspond to the display area DD-DA (see FIG. 1) and the non-display area DD-NDA (see FIG. 1) of the display device DD (see FIG. 1), respectively.

The display area DA and the non-display area NDA of the display panel DP may not be necessarily identical to the display area DD-DA (see FIG. 1) and the non-display area DD-NDA (see FIG. 1) of the display device DD (see FIG. 1), and may be changed according to the structure/design of the display panel DP.

The display panel DP includes a plurality of signal lines SGL, a plurality of pixels PX, and a pad part PD-DP.

An area where the plurality of pixels PX are disposed may be defined as the display area DA. In this exemplary embodiment, the non-display area NDA may be defined along the outline of the display area DA.

Each of the plurality of pixels PX may include a pixel electrode AE and a pixel circuit PXC. One pixel circuit PXC may be electrically connected to one pixel electrode AE to provide a predetermined voltage to the one pixel electrode AE. The pixel circuit PXC may include a plurality of pixel transistors.

The plurality of signal lines SGL include gate lines GL, data lines DL, a power line PL, and a control signal line CSL. The gate lines GL are respectively connected to corresponding pixels PX among the plurality of pixels PX, and the data lines DL are respectively connected to corresponding pixels PX among the plurality of pixels PX. The power line PL is connected to the plurality of pixels PX. Gate drive circuits DCV1 and DCV2 connected to the gate lines GL may be disposed at the non-display area NDA. The control signal line CSL may provide control signals to the gate drive circuits DCV1 and DCV2.

In FIG. 3, a configuration is exemplarily shown in which the gate drive circuits DCV1 and DCV2 are disposed on one side of the non-display area NDA and on the other side of the non-display area NDA to face each other with the display area DA therebetween. However, in another exemplary embodiment of the inventive concept, the gate drive circuit may be disposed only on one side of the non-display area NDA. For example, only the gate drive circuit DCV1 may be disposed, and the gate drive circuit DCV2 may be omitted.

The pad part PD-DP may be connected to the ends of the data lines DL, the power line PL, and the control signal line CSL, respectively. The pad part PD-DP may receive an electrical signal from an external driving circuit (not shown) and transfer it to the data lines DL, the power line PL, and the control signal line CSL.

The pad part PD-DP may be formed in the same process as the pixel circuit PXC. For example, the pad part PD-DP and a plurality of pixel transistors included in the pixel circuit PXC may be simultaneously formed through a low temperature polycrystalline silicon (LTPS) process or a low temperature polycrystalline oxide (LTPO) process.

Figure 4:
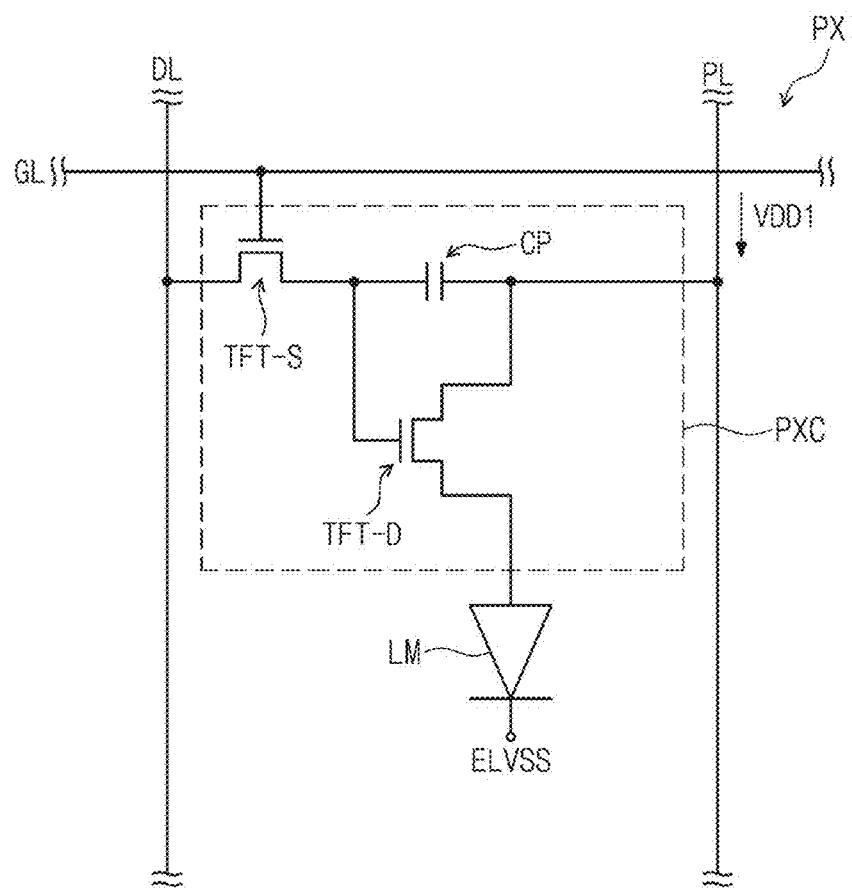
FIG. 4 is an equivalent circuit diagram of a pixel according to an exemplary embodiment.

FIG. 4 is an equivalent circuit diagram of a pixel according to an exemplary embodiment.

FIG. 4 exemplarily shows a pixel PX connected to a gate line GL, a data line DL, and the power line PL. A configuration of the pixel PX is not limited thereto and may be modified.

The pixel PX includes a light emitting element LM as a display element. The light emitting element LM may be a top light emission type diode or a bottom light emission type diode. Alternatively, the light emitting element LM may be a double-sided light emitting diode. The light emitting element LM may be an organic light emitting diode. The light emitting element LM includes the pixel electrode AE (see FIG. 3). For example, the pixel electrode AE (see FIG. 3) may be an anode electrode of the light emitting element LM.

The pixel circuit PXC may include a plurality of pixel transistors and a capacitor CP for driving the light emitting element LM. The plurality of pixel transistors may include a switching transistor TFT-S and a driving transistor TFT-D. The light emitting element LM generates light by an electrical signal provided from the pixel circuit PXC.

The switching transistor TFT-S outputs a data signal applied to the data line DL in response to a scanning signal applied to the gate line GL. The capacitor CP charges a voltage corresponding to a data signal received from the switching transistor TFT-S.

The driving transistor TFT-D is connected to the light emitting element LM. The driving transistor TFT-D controls the driving current flowing through the light emitting element LM in correspondence to the amount of charge stored in the capacitor CP. The light emitting element LM may emit light during the turn-on section of the driving transistor TFT-D.

The power line PL may provide the first power supply voltage VDD1 to the pixel PX.

Figure 5:
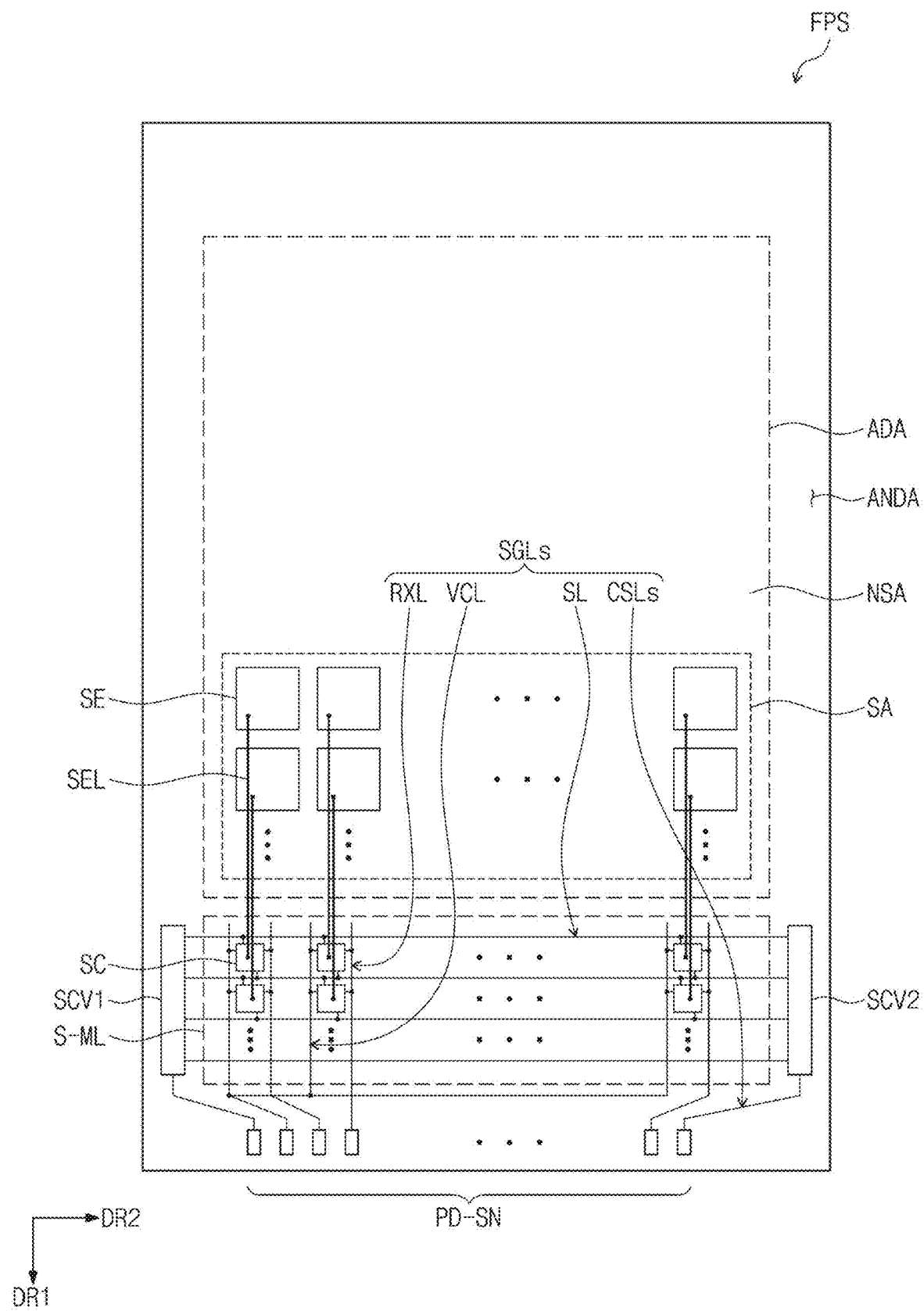
FIG. 5 is a plan view of a sensing part according to an exemplary embodiment.

FIG. 5 is a plan view of a sensing part according to an exemplary embodiment.

Referring to FIG. 5, a sensing part FPS includes an active area ADA and an inactive area ANDA on a plane. These correspond to the display area DA and the non-display area NDA of the display panel DP (see FIG. 3) previously described in FIG. 3.

The sensing part FPS may include sensing electrodes SE, sensing circuits SC, sensing lines SEL, signal lines SGLs, and a sensing pad part PD-SN.

According to an exemplary embodiment of the inventive concept, one element is defined as including one sensing electrode SE and one sensing circuit SC, and one sensing circuit SC may include a plurality of sensing transistors. In an active self cap (ASC)-type sensing part FPS in which devices are driven by a sensing circuit SC including a plurality of sensing transistors as active elements, the sensing electrodes SE and the sensing circuits SC are spaced apart from each other.

Specifically, the sensing electrodes SE may be disposed in the active area ADA and the sensing circuits SC may be disposed in the inactive area ANDA. That is, the sensing electrodes SE on the plane are arranged in an overlapping area with the display area DA (see FIG. 3) and the sensing circuits SC are arranged in an overlapping area with the non-display area NDA (see FIG. 3). The sensing lines SEL may connect the sensing electrodes SE disposed in the active area ADA and the sensing circuits SC disposed in the inactive area ANDA, respectively.

In FIG. 5, the sensing electrodes SE may be disposed at a portion of the active area ADA. Therefore, each of the display area DA (see FIG. 3) and the active area ADA on the plane are divided into the sensing area SA where the sensing electrodes SE are disposed and the non-sensing area NSA where the sensing electrodes SE are not disposed. FIG. 3 also shows the sensing area SA and the non-sensing area NSA.

Referring to FIGS. 3 and 5, when displaying the same gradation image, a difference in brightness may occur between the sensing area SA where the sensing electrode SE is disposed and the non-sensing area NSA where the sensing electrode SE is not disposed. Therefore, in order to reduce the brightness difference, the driving voltages of the pixels PX disposed in the sensing area SA and the pixels PX disposed in the non-sensing area NSA may be adjusted. For example, when the pixels PX display the same gradation, the driving voltages provided to the pixel electrodes AE arranged in the sensing area SA and the pixel electrodes AE arranged in the non-sensing area NSA may be different from each other. Specifically, the driving voltage of the pixel electrodes AE disposed in the sensing area SA may be higher than the driving voltage provided to the pixel electrodes AE disposed in the non-sensing area NSA. Thus, even if the pixels PX disposed in the sensing area SA have a higher brightness than the pixel electrodes AE disposed in the non-sensing area NSA, the brightness may be reduced by the sensing electrodes SE disposed on the top to reduce the brightness difference between the sensing area SA and the non-sensing area NSA.

Figure 18:
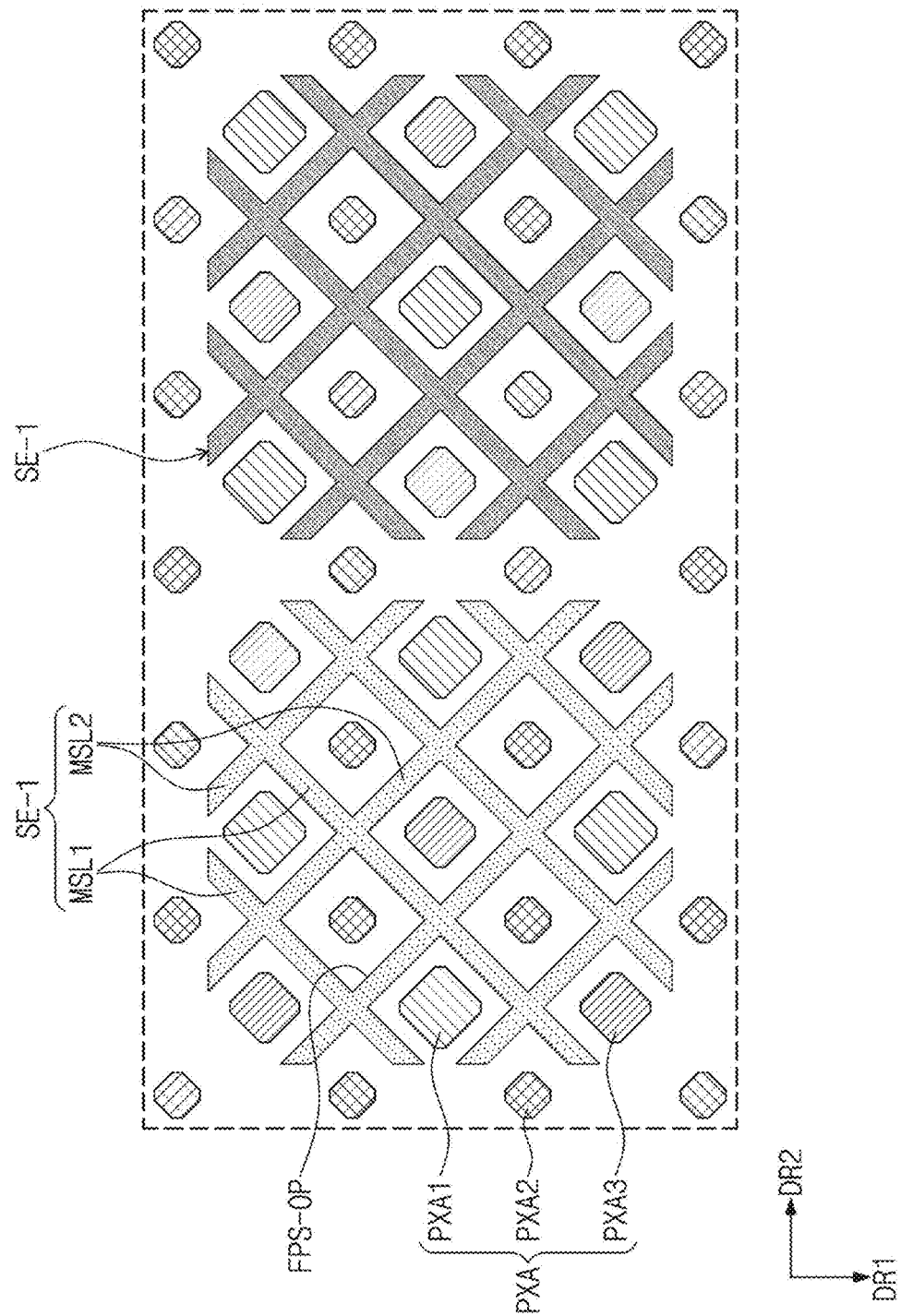
FIG. 18 is an enlarged plan view of a portion of a sensing part according to an exemplary embodiment.

Referring again to FIG. 5, the sensing electrodes SE may include a transparent conductive oxide. For example, the sensing electrodes SE may include at least one of indium zinc oxide (IZO), indium tin oxide (ITO), indium gallium oxide (IGO), indium zinc gallium oxide (IGZO), and mixtures/compounds thereof. However, the exemplary embodiments are not limited thereto. For example, the sensing electrodes SE may include a metal mesh structure. This is illustrated in FIG. 18 by way of example.

The sensing lines SEL may include the same material as the sensing electrodes SE. However, unlike this, the sensing lines SEL and the sensing electrodes SE may contain different materials. For example, the sensing lines SEL may include molybdenum, silver, titanium, copper, aluminum, or alloys thereof. However, this is exemplary, and the material constituting the sensing lines SEL is not limited to the above example.

The signal lines SGLs include scan lines SL, a power line VCL, lead-out lines RXL, and a control signal line CSLs. The signal lines SGLs may be disposed in the inactive area ANDA.

Each of the scan lines SL is connected to corresponding sensing circuits SC among a plurality of sensing circuits SC and the power line VCL is connected to a plurality of sensing circuits SC. Each of the lead-out lines RXL is connected to corresponding sensing circuits SC among a plurality of sensing circuits SC.

The scan driving circuits SCV1 and SCV2 to which the scan lines SL are connected may be disposed on one side and the other side adjacent to the area S-ML where the sensing circuits SC of the inactive area ANDA are disposed. The control signal line CSLs may provide control signals to the scan driving circuits SCV1 and SCV2. In another exemplary embodiment, any one of the scan driving circuits SCV1 and SCV2 may be omitted.

The sensing pad part PD-SN may be connected to the ends of the lead-out lines RXL, power line VCL, and control signal line CSLs, respectively. The sensing pad part PD-SN receives an electrical signal from an external driving circuit (not shown) and transfers it to the lead-out lines RXL, the power line VCL and the control signal line CSLs, or transfers the sensing signal generated in the area SA to the driving circuit.

Figure 6:
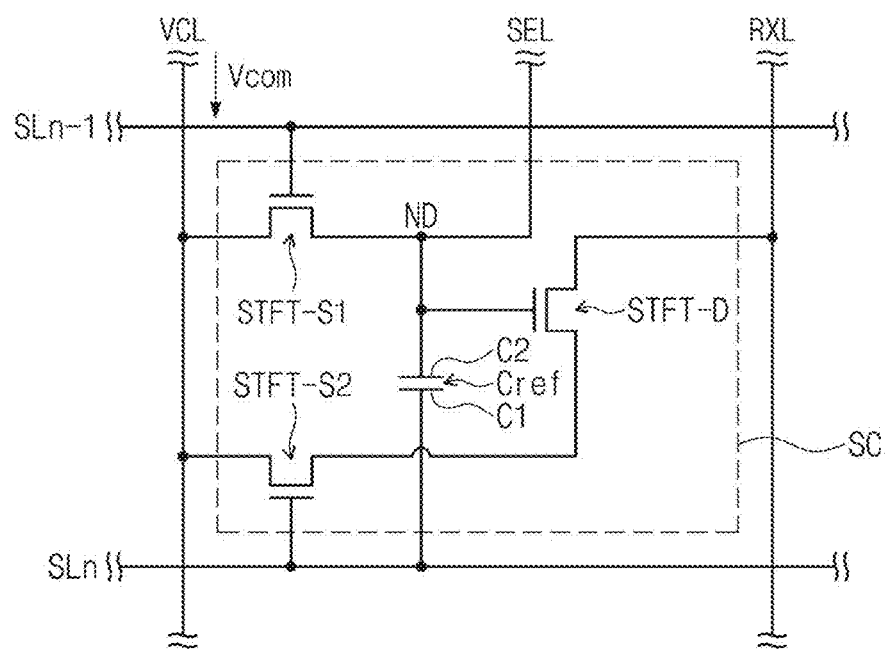
FIG. 6 is an equivalent circuit diagram of a sensing circuit according to an exemplary embodiment.

FIG. 6 is an equivalent circuit diagram of a sensing circuit according to an exemplary embodiment. FIG. 6 shows an equivalent circuit diagram of one sensing circuit SC connected to one sensing electrode SE (see FIG. 5).

FIG. 6 illustrates an example of a sensing circuit SC connected to two scan lines SLn−1 and SLn, one lead-out line RXL, a power line VCL, and one sensing line SEL, respectively. The configuration of the sensing circuit SC may be modified without being limited thereto.

The sensing circuit SC may include a plurality of sensing transistors and a capacitor Cref. Specifically, the plurality of sensing transistors may include first and second switching transistors STFT-S1 and STFT-S2, and a driving transistor STFT-D.

The first switching transistor STFT-S1 includes a first input electrode, a first output electrode, and a first control electrode. The first control electrode is connected to the n−1th scan line SLn−1 and the first input electrode is connected to the power line VCL to receive the common voltage Vcom. The first output electrode is connected to the first node ND. The first node ND is a node to which the sensing line SEL connecting the sensing circuit SC and the sensing electrode SE (see FIG. 5) is connected.

When the scan signal is applied to the n−1th scan line SLn−1, the first switching transistor STFT-S1 may be turned on and the first node ND may be initialized by the common voltage Vcom.

The second switching transistor STFT-S2 includes a second input electrode, a second output electrode, and a second control electrode. The driving transistor STFT-D includes a third input electrode, a third output electrode, and a third control electrode.

The second control electrode is connected to the nth scan line SLn and the second input electrode is connected to the power line VCL to receive the common voltage Vcom. The second output electrode may be connected to the third input electrode of the driving transistor STFT-D. The third control electrode may be connected to the first node ND, and the third output electrode may be connected to the lead-out line RXL.

The capacitor Cref includes a first electrode C1 and a second electrode C2. The first electrode C1 may be connected to the nth scan line SLn and the second electrode C2 may be connected to the first node ND.

When the scan signal is applied to the nth scan line SLn, the second switching transistor STFT-S2 is turned on, and the node connected to the second output electrode and the third input electrode is initialized by the common voltage Vcom. In addition, the voltage of the first node ND may be changed depending on the ratio of the capacitances generated by the sensing electrode SE (see FIG. 5) connected to the capacitor Cref and the sensing line SEL and the hand (for example, the ridge or valley of a fingerprint).

The current flowing through the driving transistor STFT-D may be determined according to the voltage of the first node ND, and the sensing signal may be outputted to the lead-out line RXL.

Figure 7:
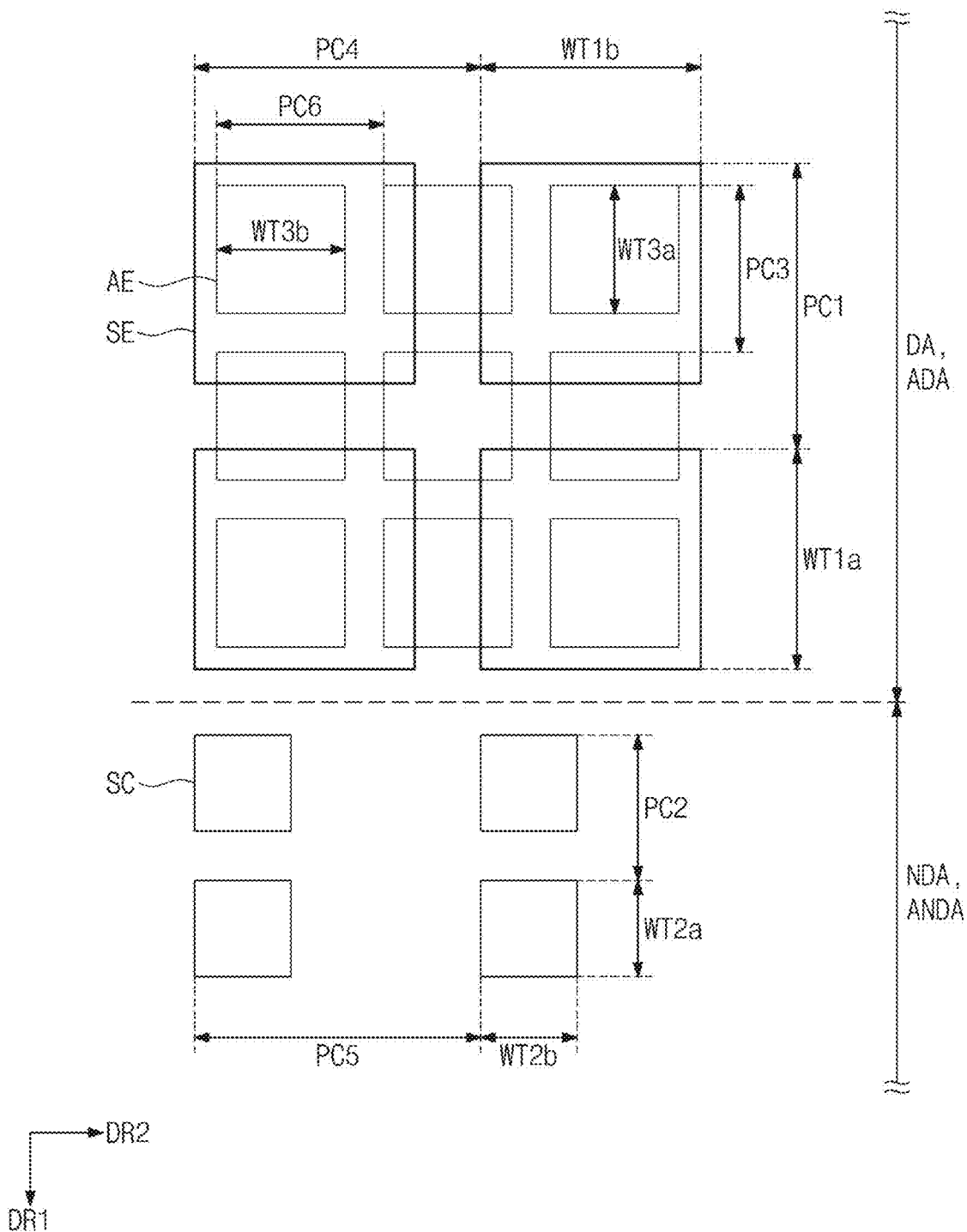
FIG. 7 is a plan view showing a part of a configuration of a display device according to an exemplary embodiment.
Figure 8:
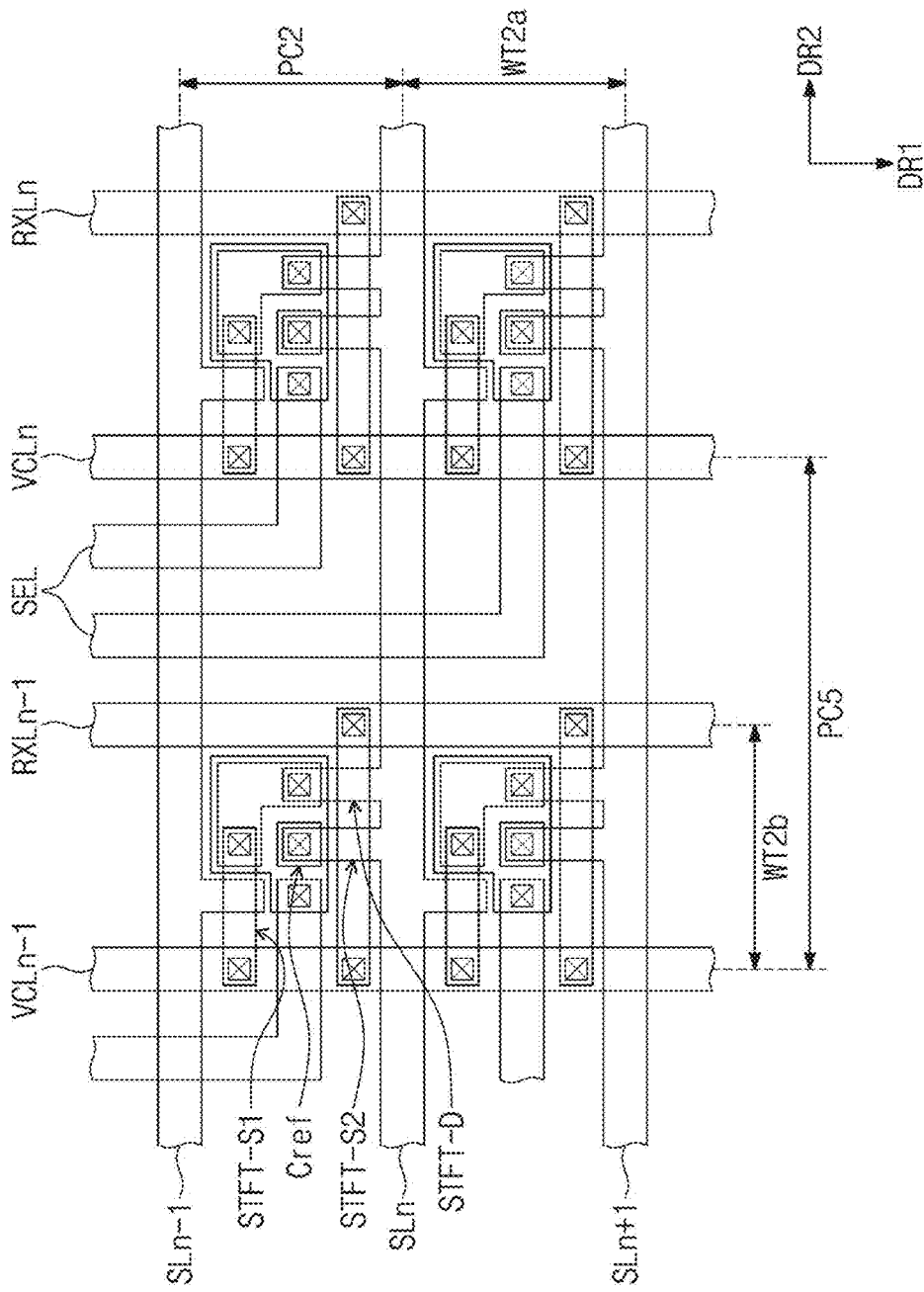
FIG. 8 is an enlarged plan view of a portion of a sensing circuit according to an exemplary embodiment.

FIG. 7 is a plan view showing a part of a configuration of a display device according to an exemplary embodiment. FIG. 8 is an enlarged plan view of a portion of a sensing circuit according to an exemplary embodiment.

FIG. 7 is a conceptual view briefly showing pixel electrodes AE, sensing electrodes SE, and sensing circuits SC for convenience of explanation. That is, the shapes of the pixel electrodes AE and the sensing electrodes SE are not limited to the rectangular shape. The shapes of the pixel electrodes AE and the sensing electrodes SE may be modified variously. Also, since the sensing circuits SC are composed of a plurality of sensing transistors and capacitors, the area in which the configurations are disposed is simply shown as a block. In FIG. 8, a part of the sensing circuits SC is shown enlarged for a specific description of the sensing circuits SC shown as a block in FIG. 7.

Referring to FIGS. 7 and 8, pixel electrodes AE, the sensing electrodes SE, and the sensing circuits SC may be arranged in a matrix along a first direction DR1 and a second direction DR2 intersecting the first direction DR1. The pixel electrodes AE and the sensing electrodes SE are disposed in the display area DA (or an active area ADA). Thus, the pixel electrodes AE and the sensing electrodes SE overlap each other on a plane. The sensing circuits SC are disposed in the non-display area NDA (or an inactive area ANDA). Accordingly, the sensing electrodes SE and the sensing circuits SC may be disposed apart from each other in the first direction DR1.

The size of the sensing electrodes SE may be larger than that of the pixel electrodes AE. Thus, one sensing electrode SE may overlap with the plurality of pixel electrodes AE.

The pitches of the sensing electrodes SE arranged in the first direction DR1 are defined as a first pitch PC1, and the pitches of the sensing circuits SC arranged in the first direction DR1 are defined as a second pitch PC2, and the pitches of the pixel electrodes AE arranged in the first direction DR1 are defined as a third pitch PC3.

The first pitch PC1 and the third pitch PC3 may be the distances between the same points of each of the sensing electrodes SE and the pixel electrodes AE. Taking the sensing electrodes SE as an example, it may be the distance between the outermost side of one first sensing electrode among the sensing electrodes SE and the outermost side of the second sensing electrode closest to the first sensing electrode. When the second sensing electrode overlaps the first sensing electrode on a plane, the outermost sides of the first sensing electrode and the outermost sides of the second sensing electrode may overlap each other.

The second pitch PC2 will be described with reference to FIG. 8. The second pitch PC2 of the sensing circuits SC may be the distance between the same configuration of each of the sensing circuits SC. For example, the second pitch PC2 may correspond to a distance between the nth scan line SLn and the n−1th scan line SLn−1 or the n+1th scan line SLn+1 adjacent to the nth scan line SLn.

In an exemplary embodiment, the first pitch PC1 may be greater than the second pitch PC2 and the third pitch PC3, and the third pitch PC3 may be greater than the second pitch PC2. That is, the second pitch PC2 may be the smallest. Therefore, even if the sensing circuits SC are disposed in the non-display area NDA, the extended dead space area may not be large.

The pitches of the sensing electrodes SE arranged in the second direction DR2 are defined as a fourth pitch PC4, and the pitches of the sensing circuits SC arranged in the second direction DR2 are defined as a fifth pitch PC5, and the pitches of the pixel electrodes AE arranged in the second direction DR2 are defined as a sixth pitch PC6.

Referring to FIG. 8, the fifth pitch PC5 of the sensing circuits SC may correspond to a distance between the nth power line VCLn and the n−1th power line VCLn−1 adjacent to the nth power line VCLn.

The fourth pitch PC4 may be equal to or greater than the fifth pitch PC5 and the fifth pitch PC5 may be greater than the sixth pitch PC6.

The first area where one of the sensing electrodes SE is disposed may be a value obtained by multiplying the width WT1$a$ of the first direction DR1 by the width WT1$b$ of the second direction DR2, and the second area where the sensing circuit SC is disposed may be a value obtained by multiplying the width WT2$a$ of the sensing circuit DR1 in the first direction by the width WT2$b$ of the second direction DR2, and the third area where the pixel electrode AE is disposed may be a value obtained by multiplying the width WT3$a$ of the first direction DR1 of the pixel electrode by the width WT3$b$ of the second direction DR2.

The widths WT1$a$, WT1$b$, WT3$a$, and WT3$b$ may be defined as values having the maximum width in each of the first direction DR1 and the second direction DR2 of the sensing electrodes SE and the pixel electrodes AE.

The widths WT2$a$ and WT2$b$ may correspond to distances between the outermost components in one sensing circuit SC. For example, the width WT2$a$ of the first direction DR1 of the sensing circuit SC may correspond to the distance between the nth scan line and the n+1th scan line, and the width WT2$b$ of the second direction DR2 may correspond to the distance between the n−1th power line VCLn−1 and the n−1th lead-out line RXLn−1.

The first area of the sensing electrode SE is larger than the second area of the sensing circuit SC and the third area of the pixel electrode AE, and the third area of the pixel electrode AE is larger than the second area of the sensing circuit SC. That is, the second area of the sensing circuit SC may be the smallest. Therefore, even if the sensing circuits SC are disposed in the non-display area NDA, the extended dead space area may not be large.

Figure 9A:
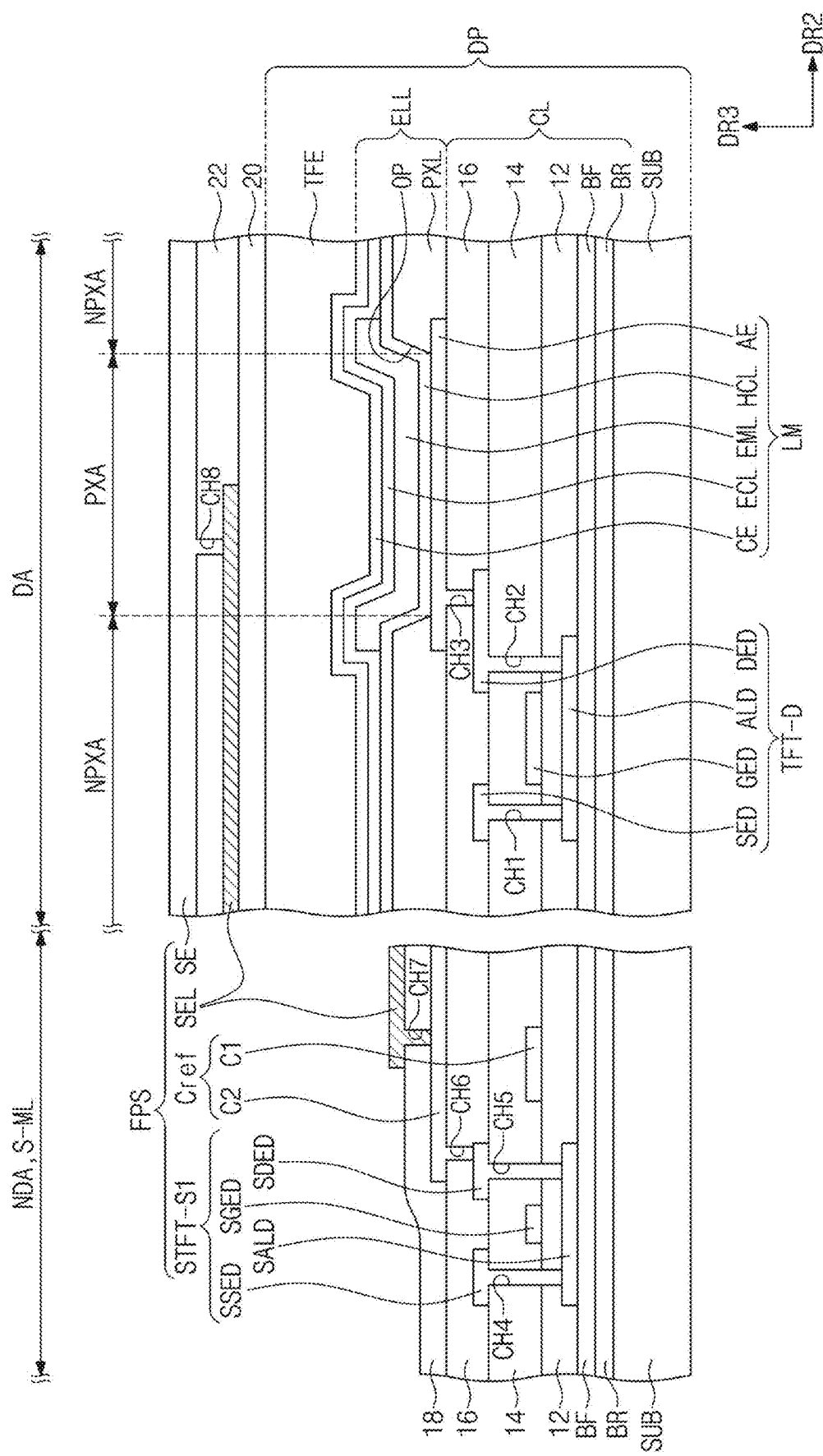
FIG. 9A is a cross-sectional view of a display device according to an exemplary embodiment.

FIG. 9A is a cross-sectional view of a display device according to an exemplary embodiment.

Referring to FIG. 9A, a display panel DP may include a base layer SUB, a circuit layer CL, a light emitting element layer ELL, and a thin encapsulation layer TFE.

The base layer SUB may include a plastic substrate, a glass substrate, a metal substrate, or an organic/inorganic composite material substrate. The plastic substrate may include at least one of acrylic resin, methacrylic resin, polyisoprene, vinyl resin, epoxy resin, urethane resin, cellulose resin, siloxane-based resin, polyimide-based resin, polyamide-based resin, and perylene resin.

The base layer SUB may define the active area ADA (see FIG. 5) and the inactive area ANDA (see FIG. 5). The active area ADA (see FIG. 5) corresponds to the display area DA shown in FIG. 9A, and the inactive area ANDA (see FIG. 5) corresponds to the non-displayed area NDA shown in FIG. 9A.

The circuit layer CL is disposed on the base layer SUB. The circuit layer CL may include a plurality of insulation layers, a plurality of conductive layers, and a semiconductor layer. For example, the circuit layer CL may include organic/inorganic layers BR, BF, 12, 14, and 16, the sensing circuit SC (see FIG. 6), and the pixel circuit PXC (see FIG. 4). Here, the pixel circuit PXC (see FIG. 4) may be arranged in the display area DA and the sensing circuit SC (see FIG. 6) may be arranged in the non-display area NDA.

The organic/inorganic layers BR, BF, 12, 14, and 16 may include functional layers BR and BF, a first insulation layer 12, a second insulation layer 14, and a third insulation layer 16. The functional layers BR and BF may be disposed on one surface of the base layer SUB. The functional layers BR and BF include at least one of a barrier layer BR or a buffer layer BF.

The pixel circuit PXC (see FIG. 4) may include a switching transistor TFT-S (see FIG. 4), a driving transistor TFT-D, and a capacitor CP (see FIG. 4). In FIG. 9A, only the driving transistor TFT-D is shown.

The semiconductor pattern ALD of the driving transistor TFT-D may be disposed on the barrier layer BR or the buffer layer BF. The semiconductor pattern ALD may be selected from amorphous silicon, polysilicon, and metal oxide semiconductors. However, exemplary embodiments are not limited thereto.

The first insulation layer 12 covering the semiconductor pattern ALD is disposed on the base layer SUB. The first insulation layer 12 includes an organic layer and/or an inorganic layer. The first insulation layer 12 may include a plurality of inorganic thin films. The plurality of inorganic thin films may include a silicon nitride layer and a silicon oxide layer.

A control electrode GED of the driving transistor TFT-D is disposed on the first insulation layer 12. The second insulation layer 14 covering the control electrode GED is disposed on the first insulation layer 12. The second insulation layer 14 includes an organic layer and/or an inorganic layer. Especially, the second insulation layer 14 may include a plurality of inorganic thin films. The plurality of inorganic thin films may include a silicon nitride layer and a silicon oxide layer.

The input electrode SED and the output electrode DED of the driving transistor TFT-D are disposed on the second insulation layer 14. The input electrode SED and the output electrode DED are connected to the semiconductor pattern ALD through the first through hole CH1 and the second through hole CH2 that pass through the first insulation layer 12 and the second insulation layer 14. On the other hand, according to another exemplary embodiment, the driving transistor TFT-D may be modified to a bottom gate structure and implemented.

The third insulation layer 16 covering the input electrode SED and the output electrode DED is disposed on the second insulation layer 14. The third insulation layer 16 includes an organic layer and/or an inorganic layer. The third insulation layer 16 may include an organic material for providing a flat surface.

One of the first insulation layer 12, the second insulation layer 14, or the third insulation layer 16 may be omitted depending on the circuit structure of the pixel. Each of the first insulation layer 12, the second insulation layer 14, and the third insulation layer 16 may be defined as an interlayer insulation layer. The interlayer insulation layer is disposed between a conductive pattern disposed at a lower part and a conductive pattern disposed at an upper part on the basis of the interlayer insulation layer to insulate the conductive patterns.

A light emitting element layer ELL is disposed on the third insulation layer 16. The light emitting element layer ELL includes a pixel defining film PXL and a light emitting element LM. A pixel electrode AE is disposed on the third insulation layer 16. The pixel electrode AE may also be referred to as an anode. The pixel electrode AE is connected to the output electrode DED of the driving transistor TFT-D through the third through hole CH3 passing through the third insulation layer 16. An opening part OP is defined in the pixel defining film PXL. The opening part OP of the pixel defining film PXL exposes a portion of the pixel electrode AE.

The light emitting element layer ELL includes a light emitting area PXA and a non-light emitting area NPXA adjacent to the light emitting area PXA. The non-light emitting area NPXA may surround the light emitting area PXA. In this embodiment, the light emitting area PXA may be defined corresponding to some area of the pixel electrode AE exposed by the opening part OP. However, the light emitting area PXA is not limited thereto, and it is sufficient if the light emitting area PXA is defined as an area where light is generated.

A hole control layer HCL may be commonly disposed in the light emitting area PXA and the non-light emitting area NPXA. Although not shown in the drawing separately, a common layer such as the hole control layer HCL may be commonly formed in the plurality of pixels PX (see FIG. 4).

A light emitting layer EML is disposed on the hole control layer HCL. The light emitting layer EML may include an organic material and/or an inorganic material. The light emitting layer EML may be divided and formed at each of the plurality of pixels PX.

An electron control layer ECL is disposed on the light emitting layer EML. A cathode CE is disposed on the electron control layer ECL. The cathode CE may be commonly disposed at the plurality of pixels PX.

Although the patterned organic light emitting layer EML is shown according to this exemplary embodiment, the light emitting layer EML may be commonly disposed at the plurality of pixels PX. At this point, the light emitting layer EML may generate white light. In this case, the display panel DP may further include a color filter (not shown). In addition, the light emitting layer EML may have a multi-layer structure.

According to this exemplary embodiment, the thin encapsulation layer TFE directly covers the cathode CE. According to an exemplary embodiment, a capping layer covering the cathode CE may be further disposed. In this case, the thin encapsulation layer TFE directly covers the cathode layer. The thin encapsulation layer TFE may include a plurality of layers in which an organic layer including an organic material and an inorganic layer including an inorganic material are alternately stacked.

The sensing part FPS may include a sensing electrode SE, a sensing circuit SC (see FIG. 5), and a sensing line SEL. In an exemplary embodiment of the inventive concept, a sensing electrode SE is disposed on a thin encapsulation layer TFE. The sensing circuit SC (see FIG. 6) and the pixel circuit PXC (see FIG. 4) may be formed at the same time through a Low Temperature Polycrystalline Silicon (LTPS) process or a Low Temperature Polycrystalline Oxide (LTPO) process.

The sensing circuit SC (see FIG. 6) includes a first switching transistor STFT-S1, a second switching transistor S-TFT-S2 (see FIG. 6), a driving transistor STFT-D (see FIG. 6), and a capacitor Cref. In FIG. 9A, only the first switching transistor STFT-S1 and the capacitor Cref are shown.

The first switching transistor STFT-S1 may include a semiconductor pattern SALD, a first control electrode SGED, a first input electrode SSED, and a first output electrode SDED.

The semiconductor pattern SALD may be disposed on the barrier layer BR or the buffer layer BF. The first control electrode SGED may be disposed on the first insulation layer 12 covering the semiconductor pattern SALD. The first input electrode SSED and the first output electrode SDED may be disposed on the second insulation layer 14 covering the first control electrode SGED. The first input electrode SSED and the first output electrode SDED are connected to the semiconductor pattern SALD through the fourth through hole CH4 and the fifth through hole CH5 that pass through the first insulation layer 12 and the second insulation layer 14.

The first electrode C1 of the capacitor Cref may be disposed on the same layer as the first control electrode SGED, and the second electrode C2 of the capacitor Cref may be disposed on the third insulation layer 16 covering the first input electrode SSED and the first output electrode SDED. The second electrode C2 is connected to the first output electrode SDED through the sixth through hole CH6 passing through the third insulation layer 16. However, this is exemplary, and the second electrode C2 may be disposed on the same layer as the first input electrode SSED and the first output electrode SDED.

A fourth insulation layer 18, covering the second electrode C2, may be disposed on the third insulation layer 16.

A buffer layer 20 may be disposed on a thin encapsulation layer TFE. The buffer layer 20 may be an inorganic layer or an organic layer. The inorganic layer may include at least one of a silicon nitride, a silicon oxynitride, a silicon oxide, a titanium oxide, or an aluminum oxide. The organic layer may include a polymer (for example, acrylic-based) organic layer. However, this is exemplary and exemplary embodiments are not limited thereto.

In an exemplary embodiment, the fourth insulation layer 18 covering the second electrode C2 may be a layer formed through the same process as the pixel defining film PXL or may be a layer formed through the same process as the buffer layer 20. Further, the fourth insulation layer 18 may be provided in a plurality of layers, and may include both a layer formed through the same process as the pixel defining film PXL and a layer formed through the same process as the buffer layer 20.

A sensing line SEL is disposed on the fourth insulation layer 18 and the buffer layer 20. The sensing line SEL extends from the display area DA to the non-display area NDA. The sensing line SEL may be connected to the second electrode C2 of the capacitor Cref through the seventh through hole CH7 passing through the fourth insulation layer 18.

Also, as described above, when the second electrode C2 is disposed on the same layer as the first input electrode SSED and the first output electrode SDED, the fourth insulation layer 18 may be omitted. In this case, the sensing line SEL may be disposed on the third insulation layer 16 and connected to the second electrode C2 of the capacitor Cref through a through hole passing through the third insulation layer 16.

A fifth insulation layer 22 may be disposed on the sensing line SEL. A sensing electrode SE may be disposed on the fifth insulation layer 22. The sensing electrode SE may be electrically connected to the sensing line SEL through an eighth through hole CH8 passing through the fifth insulation layer 22. Also, although FIG. 9A exemplarily illustrates that the fifth insulation layer 22 is disposed only in the display area DA, the fifth insulation layer 22 may extend to the non-display area NDA to cover the sensing line SEL disposed in the non-display area NDA.

According to an exemplary embodiment, in an active self-capping sensing part FPS in which the sensing electrode SE and the sensing circuit SC (see FIG. 6) are connected in a one-to-one correspondence and driven, the sensing electrode SE is disposed on the thin encapsulation layer TFE and the sensing circuit SC (see FIG. 6) is disposed on the same layer as the circuit layer CL of the display panel DP.

That is, since the sensing circuit SC and the pixel circuit PXC (see FIG. 4) are simultaneously formed through a low temperature polycrystalline silicon (LTPS) process or a low temperature polycrystalline oxide (LTPO) process, the number of masks is reduced as compared with the case of generating the sensing circuit SC (see FIG. 6) separately from the pixel circuit PXC (see FIG. 4), thereby reducing the cost.

Since the sensing electrode SE is disposed on the thin encapsulation layer TFE, the sensing sensitivity of the sensing part FPS may be further improved. Also, since the sensing circuit SC (see FIG. 6) is disposed in the non-display area NDA, in order to connect the sensing electrode SE disposed on the thin encapsulation layer TFE to the sensing circuit SC (see FIG. 6), the process of patterning the thin encapsulation layer TFE and the cathode CE disposed in the display area DA may be omitted.

Figure 9B:
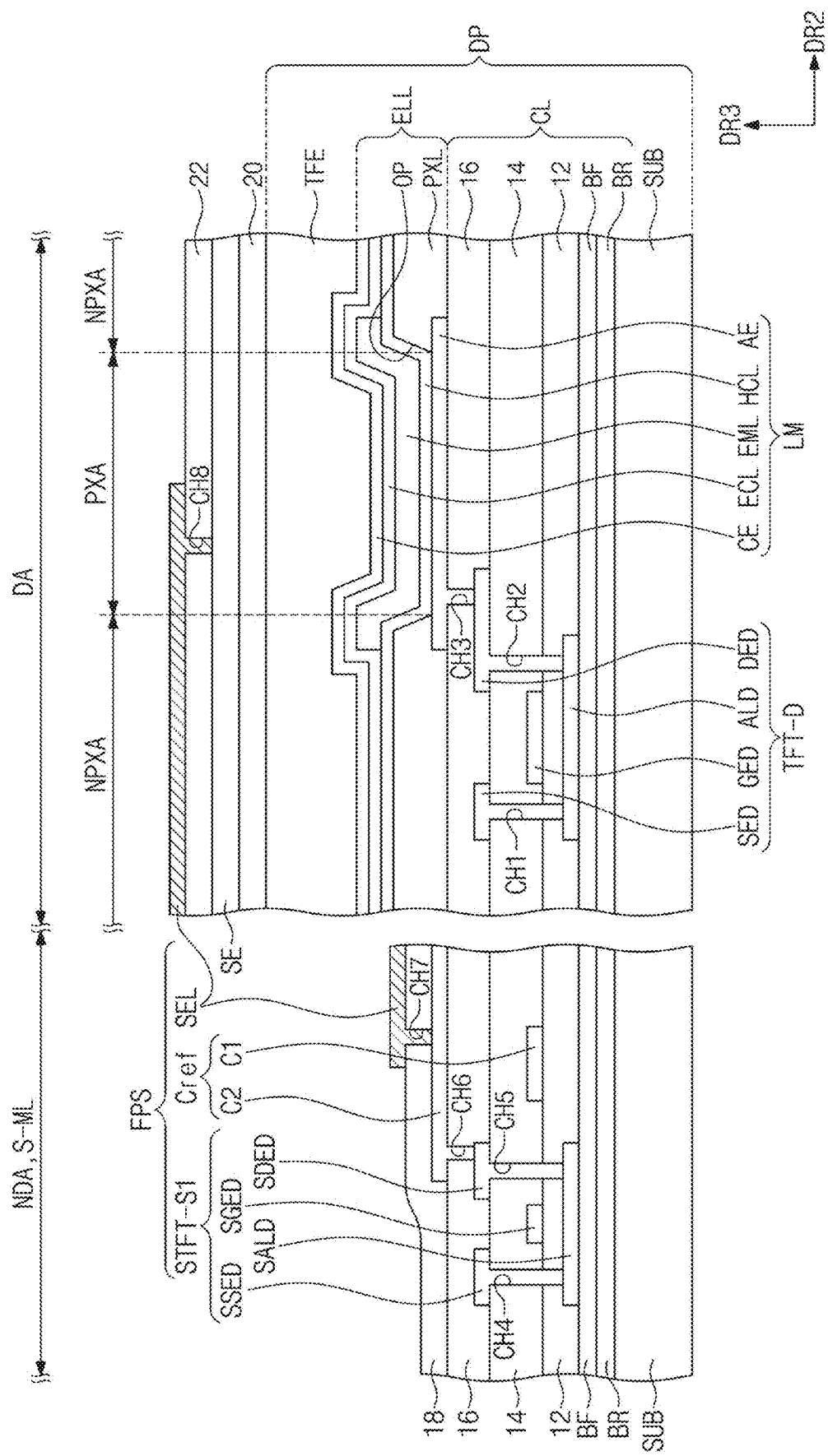
FIG. 9B is a cross-sectional view of a display device according to an exemplary embodiment.
Figure 9C:
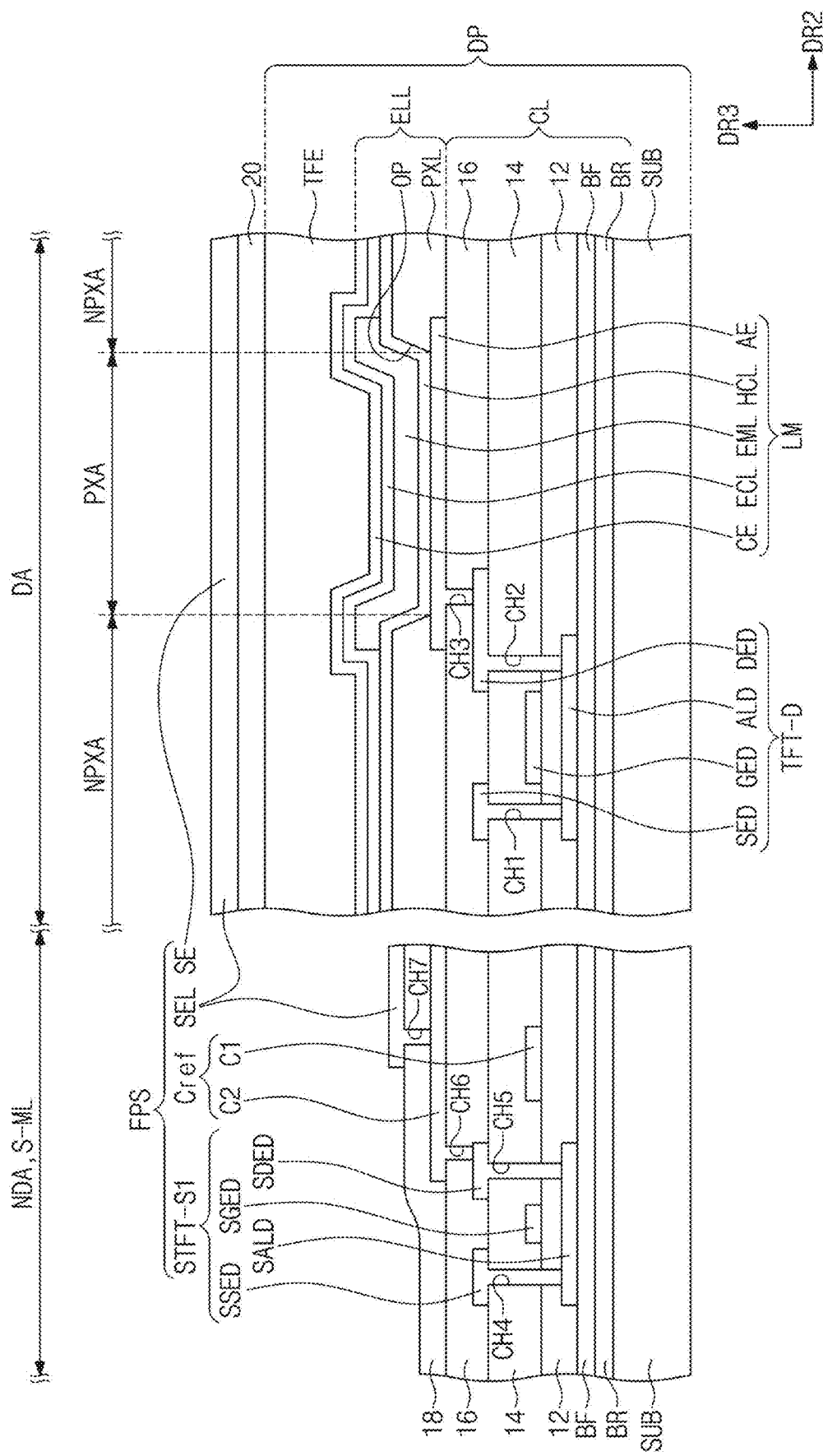
FIG. 9C is a cross-sectional view of a display device according to an exemplary embodiment.

FIG. 9B is a cross-sectional view of a display device according to an exemplary embodiment, and FIG. 9C is a cross-sectional view of a display device according to an exemplary embodiment. In FIGS. 9B and 9C, the differences from FIG. 9A will be mainly described, and the same reference numerals are given to the components described with reference to FIG. 9A, and a description thereof will be omitted.

The positional relationship between the sensing line SEL and the sensing electrode SE is not limited to the position shown in FIG. 9A, and may be variously changed. Hereinafter, some examples will be described.

Referring to FIG. 9B, a sensing electrode SE may be disposed between a buffer layer 20 and a fifth insulation layer 22, and a sensing line SEL may be disposed on the fifth insulation layer 22. In other words, compared with FIG. 9A, the positions of the sensing line SEL and the sensing electrode SE may be reversed.

In addition, referring to FIG. 9C, the sensing line SEL and the sensing electrode SE may be disposed on the same layer. That is, both the sensing line SEL and the sensing electrode SE may be disposed on the buffer layer 20.

The sensing line SEL and sensing electrode SE may be formed simultaneously through the same process. In this case, one area on the same layer may be referred to as the sensing electrode SE and another area may be referred to as the sensing line SEL. However, the exemplary embodiments are not limited thereto, and the sensing line SEL and the sensing electrode SE may be formed through processes different from each other with mutually different materials.

Figure 10:
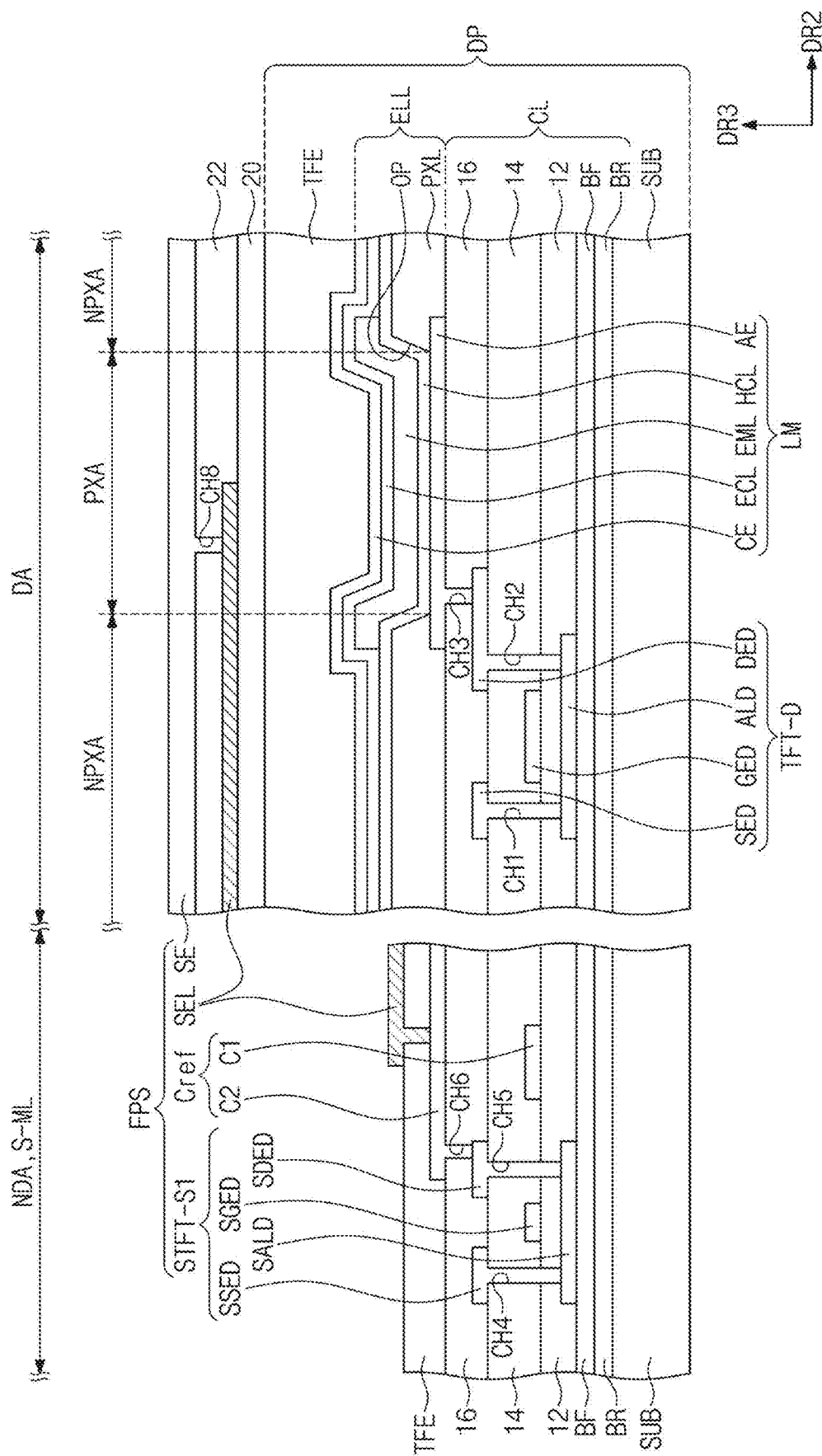
FIG. 10 is a cross-sectional view of a display device according to an exemplary embodiment.

FIG. 10 is a cross-sectional view of a display device according to an exemplary embodiment.

In FIG. 10, the differences from FIG. 9A will be mainly described, and the same reference numerals are given to the components described with reference to FIG. 9A, and a description thereof will be omitted.

Referring to FIG. 10, a thin encapsulation layer TFE may extend to the area 5-ML where the sensing circuits SC (see FIG. 6) are disposed. In this case, in order to connect the sensing electrode SE disposed on the thin encapsulation layer TFE to the sensing circuit SC (FIG. 6), only the thin encapsulation layer TFE disposed in the non-display area NDA needs to be penetrated, and the process of patterning the thin encapsulation layer TFE and the cathode CE disposed in the display area DA may be omitted.

Figure 11:
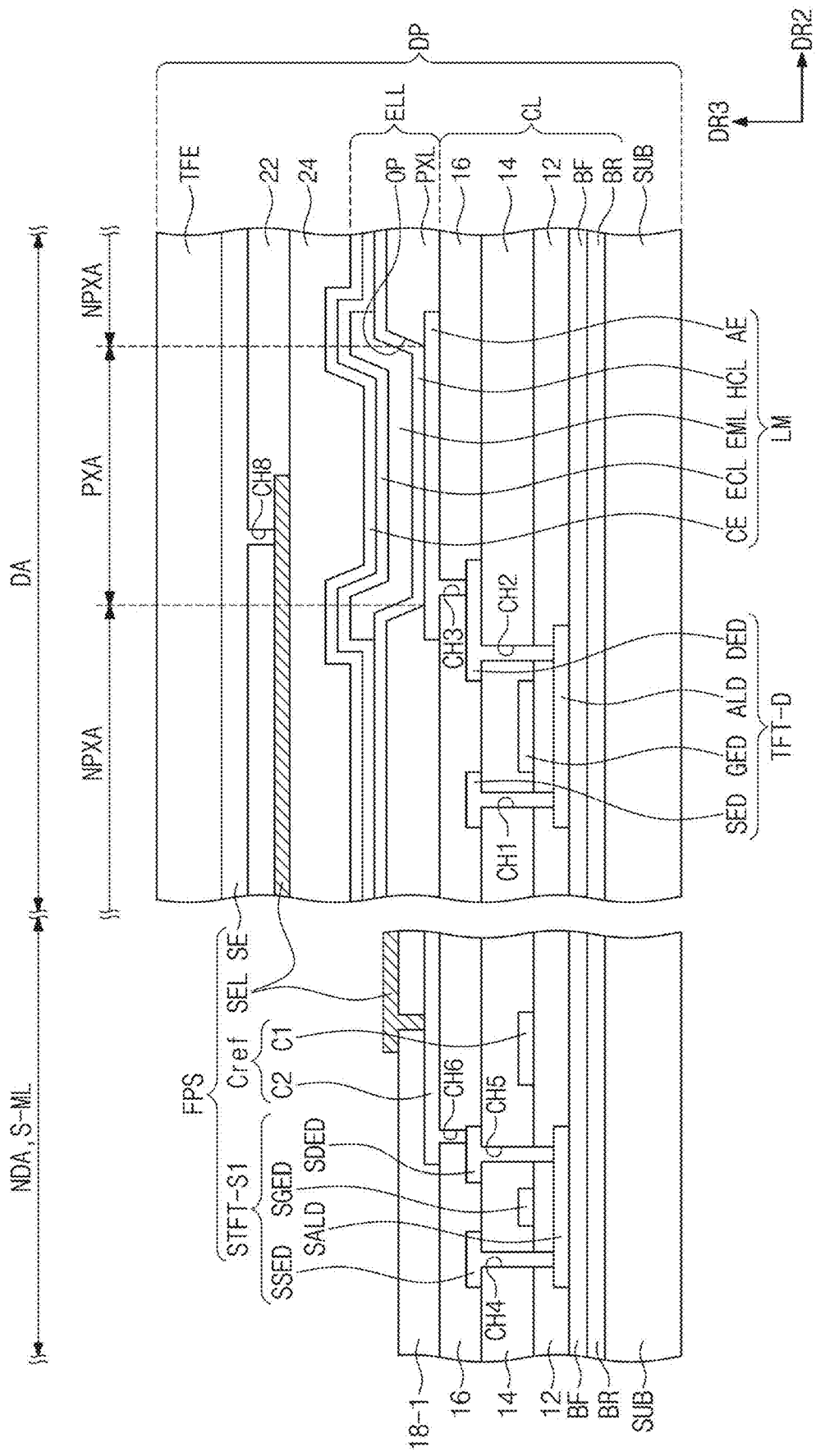
FIG. 11 is a cross-sectional view of a display device according to an exemplary embodiment.

FIG. 11 is a cross-sectional view of a display device according to an exemplary embodiment.

In FIG. 11, the differences from FIG. 9A will be mainly described, and the same reference numerals are given to the components described with reference to FIG. 9A, and a description thereof will be omitted.

Referring to FIG. 11, the sensing electrode SE may be disposed between a light emitting element layer ELL and a thin encapsulation layer TFE. At this time, an insulation layer 24 may be further disposed on the light emitting element layer ELL, and a sensing electrode SE may be disposed on the insulation layer 24.

In an exemplary embodiment, the fourth insulation layer 18-1 covering the second electrode C2 may be a layer formed through the same process as the pixel defining film PXL or may be a layer formed through the same process as the insulation layer 24. Further, the fourth insulation layer 18-1 may be provided in a plurality of layers, and may include both a layer formed through the same process as the pixel defining film PXL and a layer formed through the same process as the insulation layer 24.

In this case, in order to connect the sensing electrode SE disposed below the thin encapsulation layer TFE to the sensing circuit SC (see FIG. 6), only the fourth insulation layer 18-1 disposed in the non-display area NDA needs to be penetrated, and the process of patterning the cathode CE disposed in the display area DA may be omitted.

Figure 12:
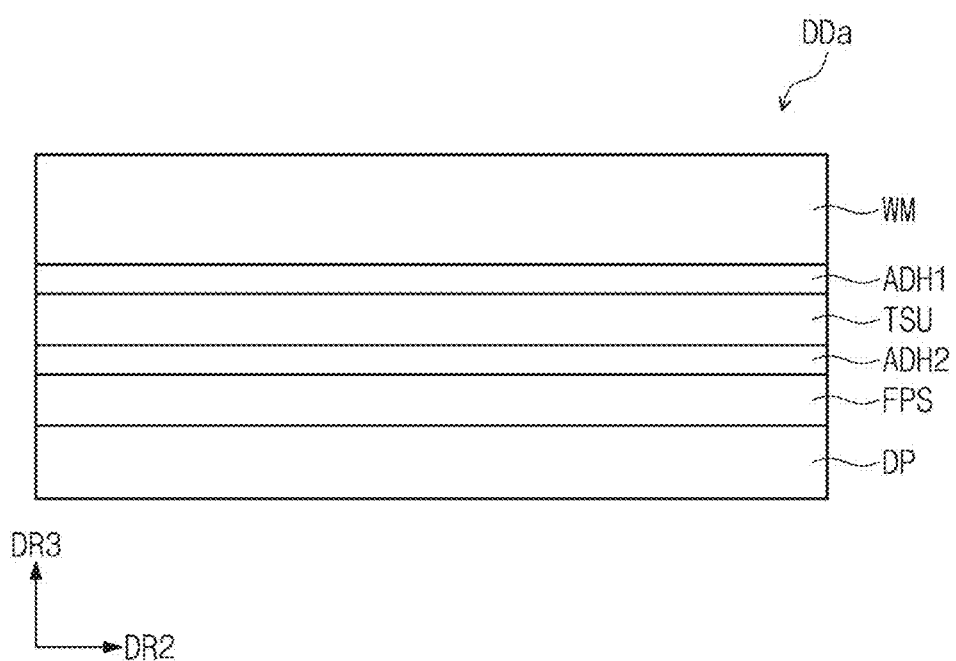
FIG. 12 is a cross-sectional view of a display device according to an exemplary embodiment.

FIG. 12 is a cross-sectional view of a display device according to an exemplary embodiment.

Referring to FIG. 12, the display device DDa may include a display panel DP, a sensing part FPS, a touch sensing part TSU, and a window WM. As described above, the display panel DP and the sensing part FPS may be fabricated through a continuous process. The touch sensing part TSU may be provided separately from the sensing part FPS and may include touch electrodes that sense an external input.

A first adhesive member ADH1 may be disposed between the touch sensing part TSU and the window WM and a second adhesive member ADH2 may be disposed between the integrated display panel DP and sensing part FPS and the touch sensing part TSU. The first and second adhesive members ADH1 and ADH2 may be an organic adhesive layer such as an Optically Clear Adhesive (OCA) film, Optically Clear Resin (OCR), or a Pressure Sensitive Adhesive (PSA) film. The organic adhesive layer may include an adhesive material such as a polyurethane, polyacrylic, polyester, polyepoxy, and polyvinyl acetate.

Figure 13:
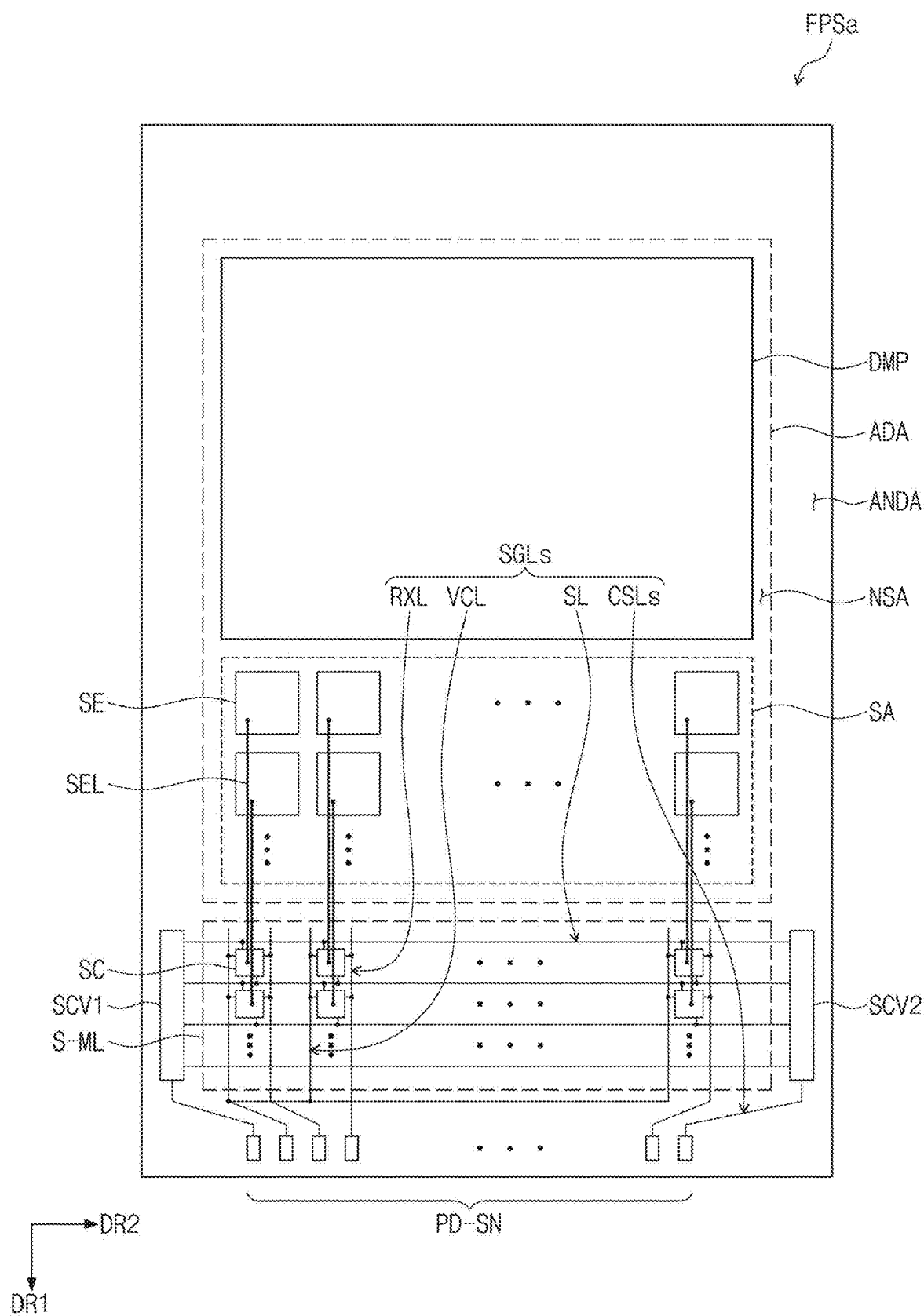
FIG. 13 is a plan view of a sensing part according to an exemplary embodiment.

FIG. 13 is a plan view of a sensing part according to an exemplary embodiment. In FIG. 13, the differences from FIG. 5 will be mainly described, and the same reference numerals are given to the components described with reference to FIG. 5, and a description thereof will be omitted.

Referring to FIGS. 12 and 13, the touch sensing part TSU may include touch electrodes (not shown) disposed on the whole surface of the display area DA. Therefore, a brightness difference may occur between the sensing area SA where the sensing electrode SE is disposed and the non-sensing area NSA where the sensing electrode SE is not disposed.

To compensate for this, the sensing part FPSa may further include a dummy pattern DMP disposed in the non-sensing area NSA. Since the sensing part FPSa further includes the dummy pattern DMP, the brightness difference between the sensing area SA and the non-sensing area NSA may be reduced.

The dummy pattern DMP may be floating electrodes that are not externally applied with a separate electrical signal. Also, exemplary embodiments are not limited thereto, and the dummy pattern DMP may be provided with a constant level of DC voltage, and the dummy pattern DMP may be controlled in the ground state.

In FIG. 13, the dummy pattern DMP is shown in the form of a single electrode arranged in a non-sensing area NSA, but exemplary embodiments are not limited thereto. For example, the dummy pattern DMP may be provided in the same form as the sensing electrode SE.

Figure 14:
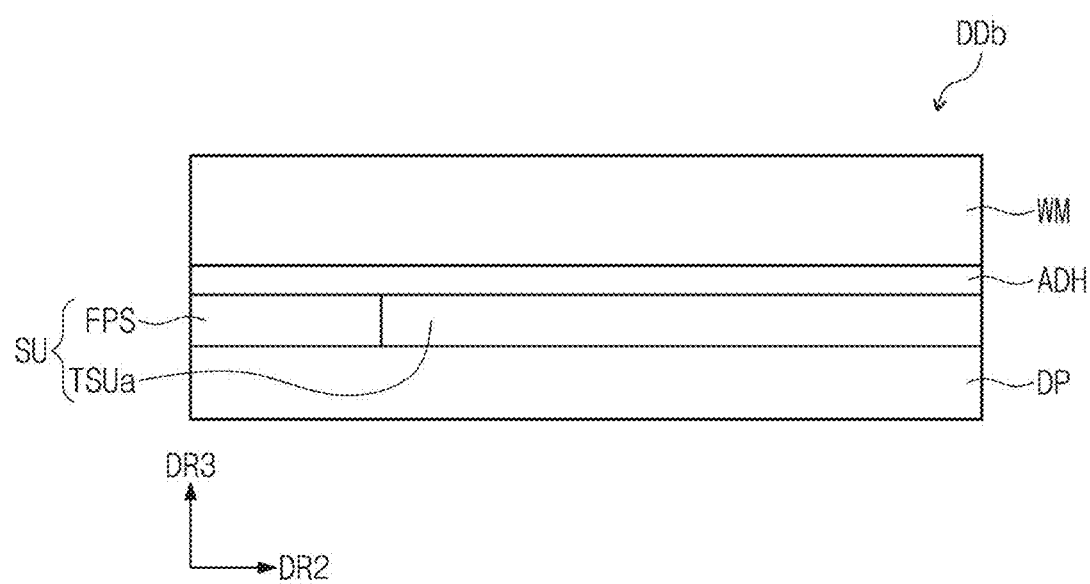
FIG. 14 is a cross-sectional view of a display device according to an exemplary embodiment.

FIG. 14 is a cross-sectional view of a display device according to an exemplary embodiment.

Referring to FIG. 14, the display device DDb may include a display panel DP, a sensing part FPS, a touch sensing part TSUa, and a window WM.

As described above, the display panel DP and the sensing part FPS may be fabricated through a continuous process. In addition, the display panel DP and touch sensing part TSUa may also be fabricated through a continuous process. The touch sensing part TSUa and the sensing electrode SE (see FIG. 5) of the sensing part FPS may be formed simultaneously through the same process. Hereinafter, the touch sensing part TSUa and the sensing part FPS are integrated to be referred to as an integrated sensing part SU.

An adhesive member ADH may be disposed between the integrated sensing part SU and the window WM. The adhesive members ADH may be an organic adhesive layer such as an Optically Clear Adhesive (OCA) film, Optically Clear Resin (OCR), or a Pressure Sensitive Adhesive (PSA) film. The organic adhesive layer may include an adhesive material such as a polyurethane, polyacrylic, polyester, polyepoxy, and polyvinyl acetate. However, this is exemplary and the adhesive member ADH may be omitted.

Figure 15:
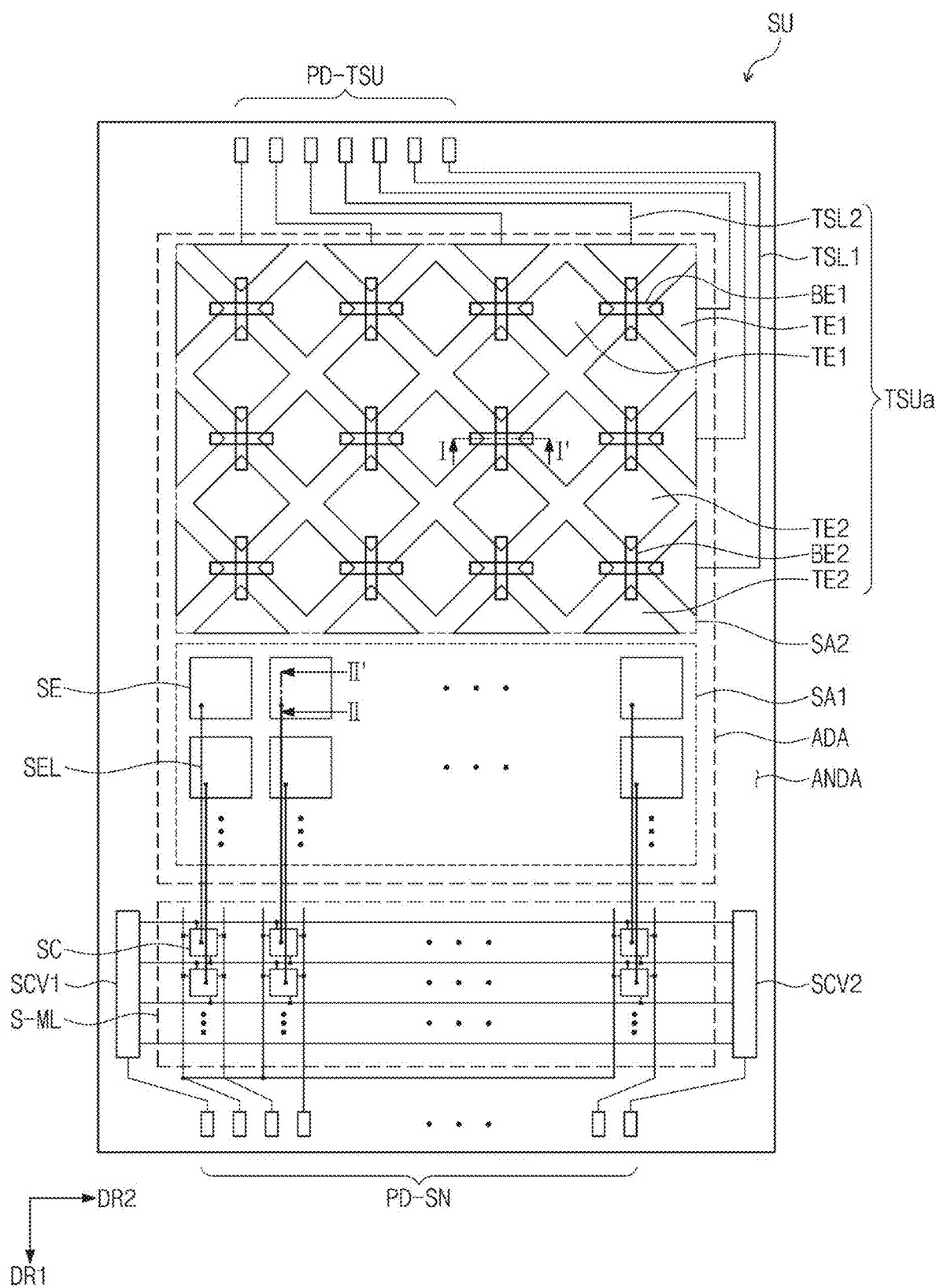
FIG. 15 is a plan view of an integrated sensing part according to an exemplary embodiment.

FIG. 15 is a plan view of an integrated sensing part according to an exemplary embodiment.

Referring to FIG. 15, the touch sensing part TSUa includes first touch electrodes TE1, second touch electrodes TE2, first connection electrodes BE1, second connection electrodes BE2, first lines TSL1, second lines TSL2, and a touch pad part PD-TSU. The sensing electrodes SE may be disposed in the first area SA1 of the display area DA and the first and second touch electrodes TE1 and TE2 may be disposed in the second area SA2.

The first touch electrodes TE1 are arranged along the second direction DR2 and the first touch electrodes TE1 spaced apart in the second direction DR2 are electrically connected to each other by the first connection electrode BE1.

The second touch electrodes TE2 are arranged along the first direction DR1 and the second touch electrodes TE2 spaced apart in the first direction DR1 are electrically connected to each other by the second connection electrode BE2.

The first lines TSL1 may be electrically connected to the first touch electrodes TE1 and the second lines TSL2 may be electrically connected to the second touch electrodes TE2.

The touch pad part PD-TSU may be electrically connected to the first lines TSL1 and the second lines TSL2. The touch pad part PD-TSU receives an electrical signal from an external driving circuit (not shown) and transfers it to the first lines TSL1 and the second lines TSL2 or transfers an external touch sensing signal generated in the second area SA2 to the driving circuit.

Each of the touch pad part PD-TSU and the sensing pad part PD-SN may be connected to a separate driving circuit. However, exemplary embodiments are not limited thereto. For example, in another exemplary embodiment, the touch pad part PD-TSU and the sensing pad part PD-SN may be disposed in adjacent areas and connected to the same drive circuit.

Figure 16:
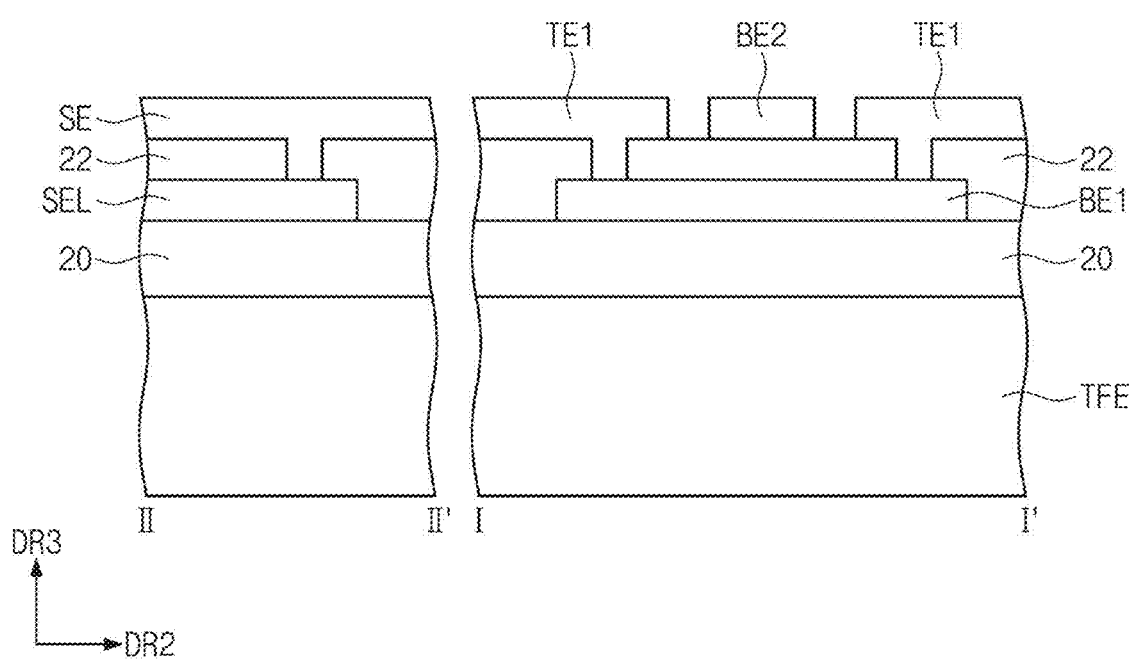
FIG. 16 is a cross-sectional view taken along line I-I' of FIG. 15 and II-II' of FIG. 15.

FIG. 16 is a cross-sectional view taken along line I-I' of FIG. 15 and of FIG. 15.

Referring to FIGS. 15 and 16, some of the first touch electrodes TE1, the second touch electrodes TE2, the first connection electrodes BE1, and the second connection electrodes BE2 may be disposed between the buffer layer 20 and the fifth insulation layer 22, and the other may be disposed on the fifth insulation layer 22.

In this case, the configuration disposed between the buffer layer 20 and the fifth insulation layer 22 is formed through the same process as the sensing line SEL, and the configuration disposed on the fifth insulation layer 22 is formed through the same process as the sensing electrode SE.

In FIG. 16, it is shown exemplarily that the first connection electrode BE1 is disposed between the buffer layer 20 and the fifth insulation layer 22, and the first touch electrodes TE1, the second touch electrodes TE2, and the second connection electrodes BE2 are disposed on the fifth insulation layer 22. The sensing line SEL and the first connection electrode BE1 may be formed through the same process, and the first touch electrodes TE1, the second touch electrodes TE2, the second connection electrodes BE2, and the sensing electrode SE may be formed through the same process. However, the layer arrangement shown in FIG. 16 is illustratively shown, and exemplary embodiments are not limited thereto.

Figure 17:
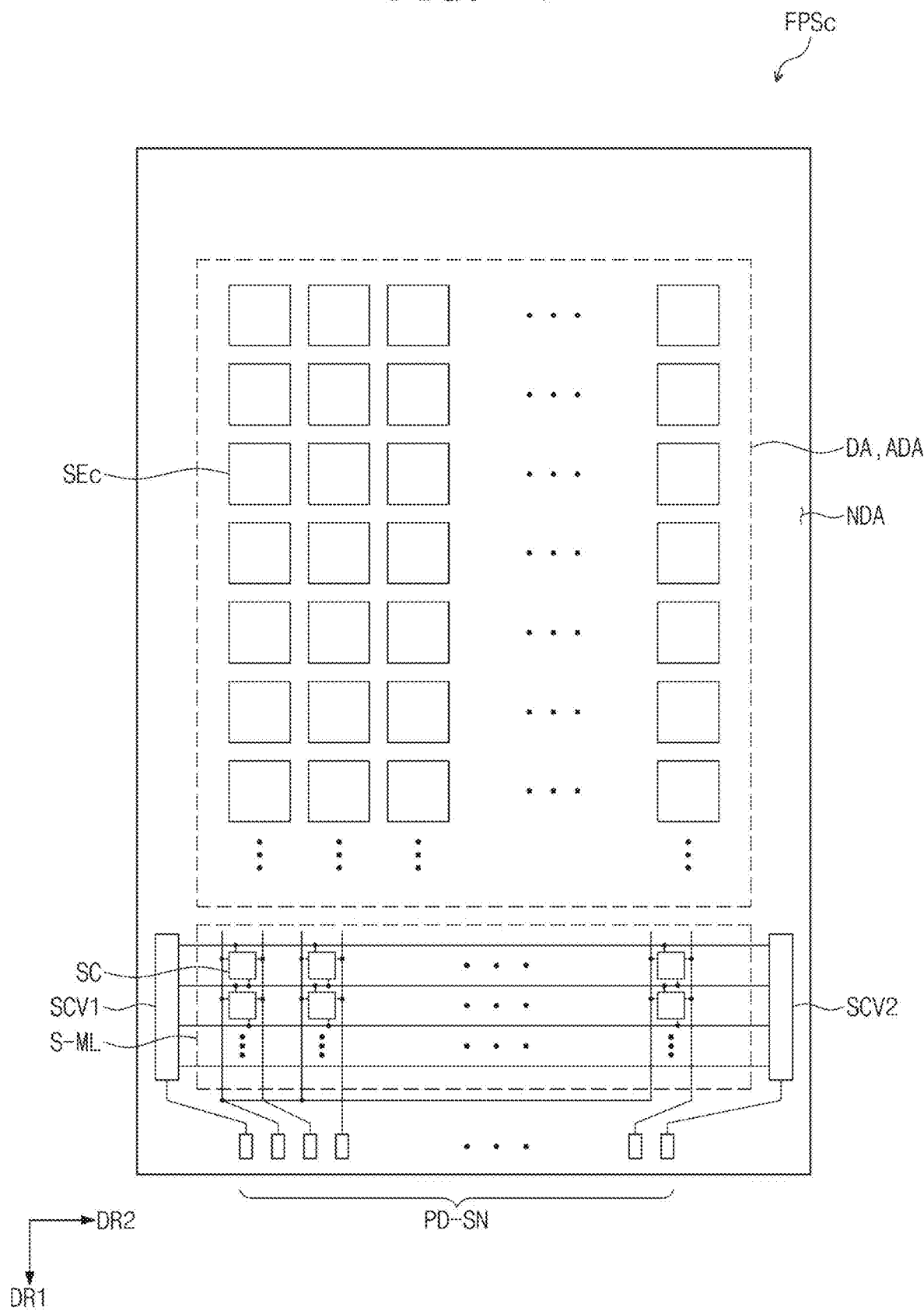
FIG. 17 is a plan view of a sensing part according to an exemplary embodiment.

FIG. 17 is a plan view of a sensing part according to an exemplary embodiment. In FIG. 17, the differences from FIG. 5 will be mainly described, and the same reference numerals are given to the components described with reference to FIG. 5, and a description thereof will be omitted.

Referring to FIG. 17, the sensing electrodes SEc of the sensing part FPSc may be disposed in the entire area of the display area DA (or active area ADA). The sensing part FPSc disposed in the entire area of the display area DA may recognize fingerprints and touches in the entire area. Accordingly, the touch sensing part TSU described with reference to FIG. 12 and the touch sensing part TSUa described with reference to FIG. 14 may be omitted.

FIG. 18 is an enlarged plan view of a portion of a sensing part according to an exemplary embodiment.

Referring to FIG. 18, the sensing electrode SE-1 may include a metal mesh structure. Therefore, since the sensing electrode SE-1 is made of an opaque material, the possibility that the sensing electrode SE-1 is visible from the outside may be reduced. The sensing electrode SE-1 includes a plurality of mesh lines MSL1 and MSL2 and the mesh lines MSL1 and MLS2 may be arranged to intersect with each other such that opening parts FPS-OP are defined. The opening parts FPS-OP may be defined at positions corresponding to the light emitting areas PXA and may be defined to have an area larger than the area of each of the light emitting areas PXA.

The light emitting areas PXA may include a first light emitting area PXA1, a second light emitting area PXA2, and a third light emitting area PXA3.

In an exemplary embodiment, the first light emitting area PXA1 may emit a first light having a first wavelength, and the second light emitting area PXA2 may emit a second light having a second wavelength, and the third light emitting area PXA3 may emit a third light having a third wavelength. The first wavelength may be shorter than the second wavelength, and the second wavelength may be shorter than the third wavelength. For example, the first light may be blue light, the second light may be green light, and the third light may be red light.

Although the sensing electrodes described above with reference to FIGS. 5 to 17 may be replaced with a metal mesh structure. In addition, in FIG. 18, the sensing electrode SE-1 having a quadrangular outer line is shown, but exemplary embodiments are not limited thereto and may be modified into various forms.

According to the various exemplary embodiments, the sensing sensitivity of the sensing part may be improved because the sensing electrode is disposed on the thin encapsulation layer. Further, since the sensing circuit is disposed in the non-display area, a process of patterning the thin encapsulation layer and the cathode overlapping the display area in order to connect the sensing electrode disposed on the thin encapsulation layer to the sensing circuit may be omitted.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel comprising a display area and a non-display area disposed outside of the display area;
   a sensing part comprising a plurality of sensing electrodes, a plurality of sensing circuits corresponding to the plurality of sensing electrodes, and a plurality of sensing lines connecting the plurality of sensing electrodes and the plurality of sensing circuits; and
   a plurality of pixel electrodes disposed in the display area, wherein the plurality of sensing electrodes are disposed in an area overlapping the display area, and the plurality of sensing circuits are disposed in an area overlapping the non-display area,
wherein each of the plurality of sensing circuits comprises a plurality of transistors and a capacitor,
wherein the capacitor is electrically connected to a corresponding sensing line among the plurality of sensing lines, and wherein
the display area is divided into a sensing area where the plurality of sensing electrodes are disposed and a non-sensing area where the plurality of sensing electrodes are not disposed, and
wherein when a same gradation is simultaneously displayed in the sensing area and the non-sensing area, a driving voltage provided to the pixel electrodes disposed in the sensing area is greater than a driving voltage provided to the pixel electrodes disposed in the non-sensing area.

2. The display device of claim 1, wherein the display panel further comprises a plurality of pixel circuits disposed in the display area and electrically connected to the plurality of pixel electrodes.

3. The display device of claim 2, wherein the display panel further comprises:
a base layer;
a circuit layer disposed on the base layer and comprising the plurality of pixel circuits and the plurality of sensing circuits;
a light emitting element layer disposed on the circuit layer; and
a thin encapsulation layer configured to cover the light emitting element layer.

4. The display device of claim 3, wherein the plurality of sensing electrodes are disposed on the thin encapsulation layer.

5. The display device of claim 3, wherein the plurality of sensing electrodes are disposed between the light emitting element layer and the thin encapsulation layer.

6. The display device of claim 3, further comprising an insulation layer disposed on the plurality of sensing circuits,
wherein the plurality of sensing lines are disposed on the insulation layer, and each of the plurality of sensing lines is electrically connected to each of the plurality of sensing circuits through a through hole provided in the insulation layer.

7. The display device of claim 6, wherein the insulation layer is the thin encapsulation layer.

8. The display device of claim 2, wherein the sensing part further comprises a dummy pattern disposed in the non-sensing area, and
wherein the dummy pattern is disposed on a same layer as the plurality of sensing electrodes.

9. The display device of claim 8, wherein the dummy pattern is provided with a predetermined level of voltage.

10. A display device comprising:
a display panel comprising a display area and a non-display area disposed outside of the display area;
a sensing part comprising a plurality of sensing electrodes, a plurality of sensing circuits corresponding to the plurality of sensing electrodes, and a plurality of sensing lines connecting the plurality of sensing electrodes and the plurality of sensing circuits; and
a plurality of pixel electrodes disposed in the display area and a plurality of pixel circuits disposed in the display area and electrically connected to the plurality of pixel electrodes, wherein the plurality of sensing electrodes are disposed in an area overlapping the display area, and the plurality of sensing circuits are disposed in an area overlapping the non-display area,
wherein each of the plurality of sensing circuits comprises a plurality of transistors and a capacitor,
wherein the capacitor is electrically connected to a corresponding sensing line among the plurality of sensing lines, and wherein:
the plurality of sensing electrodes, the plurality of sensing circuits, and the plurality of pixel electrodes are arranged in a matrix along a first direction and a second direction intersecting the first direction,
one sensing electrode of the plurality of sensing electrodes overlaps two or more pixel electrodes of the plurality of pixel electrodes on a plane,
a pitch of the plurality of sensing electrodes arranged in the first direction is defined as a first pitch,
a pitch of the plurality of sensing circuits arranged in the first direction is defined as a second pitch,
a pitch of the plurality of pixel electrodes arranged in the first direction is defined as a third pitch,
a pitch of the plurality of sensing electrodes arranged in the second direction is defined as a fourth pitch,
a pitch of the plurality of sensing circuits arranged in the second direction is defined as a fifth pitch,
a pitch of the plurality of pixel electrodes arranged in the second direction is defined as a sixth pitch, and
the first pitch is larger than the second pitch and the third pitch, the third pitch is larger than the second pitch, the fourth pitch is larger than or equal to the fifth pitch, and the fifth pitch is larger than the sixth pitch.

11. The display device of claim 2, wherein on a plane, a first area where one of the plurality of sensing electrodes is disposed is greater than a second area where one of the plurality of sensing circuits is disposed and a third area where one of the plurality of pixel electrodes is disposed, and the third area is larger than the second area.

12. The display device of claim 1, further comprising a touch sensing part disposed on the sensing part.

13. The display device of claim 1, further comprising a touch sensing part disposed on the display panel and comprising a plurality of touch sensing electrodes,
wherein the plurality of touch sensing electrodes are disposed on a same layer as the plurality of sensing electrodes.

14. The display device of claim 1, wherein the plurality of sensing electrodes are disposed in the entire display area on a plane.

15. The display device of claim 1, wherein:
the plurality of sensing circuits comprise a first sensing circuit,
the plurality of sensing electrodes comprise a first sensing electrode electrically connected to the first sensing circuit,
a voltage value of a node, to which the first sensing circuit and the first sensing electrode are electrically connected, is controlled by the first sensing circuit, and
the first sensing electrode is configured to form a capacitance with an external object to change the voltage value of the node.

16. A display device comprising:
a display panel where a display area and a non-display area are defined on a plane; and
a sensing part comprising:
a sensing electrode disposed in an area overlapping with the display area on the plane, and a sensing circuit disposed in an area overlapping with the non-display area on the plane, the sensing circuit comprising a first switching transistor, a second switching transistor, a driving transistor, and a capacitor, and a sensing line, a scan line, and a lead-out line electrically connected to the sensing circuit, wherein:

the first switching transistors, a first terminal of the driving transistor, the sensing electrode, and the capacitor are connected to a node, and a second terminal of the driving transistor is connected to the second switching transistor, wherein a voltage value of the node is controlled by a scan signal applied to the scan line, wherein the sensing electrode is configured to form a capacitance with an external object to change the voltage value of the node and configured to output a sensing signal through the lead-out line, and wherein the first switching transistor and the second switching transistor are directly connected to a same power line.

17. The display device of claim 16, wherein the display panel comprises a base layer, a circuit layer disposed on the base layer, a light emitting element layer disposed on the circuit layer, and a thin encapsulation layer disposed on the light emitting element layer, and wherein the sensing electrode is disposed on the thin encapsulation layer and the sensing circuit is disposed on the base layer to be disposed on a same layer as the circuit layer.

18. A sensing part comprising:

a base layer comprising an active area and an inactive area;

a sensing circuit disposed in the inactive area and comprising a first switching transistor, a second switching transistor, a driving transistor, and a capacitor;

an insulation layer configured to cover the sensing circuit and disposed on the base layer;

a sensing electrode disposed on the insulation layer and disposed in the active area; and a sensing line electrically connecting the sensing electrode and the capacitor of the sensing circuit, wherein the sensing line is electrically connected to the sensing circuit through a through hole provided in the insulation layer in the inactive area, wherein a voltage value of a node where the capacitor of the sensing circuit is connected to the sensing electrode is controlled by the plurality of sensing driving transistors, wherein:

the first switching transistor, a first terminal of the driving transistor, the sensing electrode, and the capacitor are connected to the node, and a second terminal of the driving transistor is connected to the second switching transistor, and wherein the first switching transistor and the second switching transistor are connected to a same power line for supplying an initialization voltage of the node.

* * * * *